(12) United States Patent
Matthies et al.

(10) Patent No.: US 6,897,855 B1
(45) Date of Patent: May 24, 2005

(54) TILED ELECTRONIC DISPLAY STRUCTURE

(75) Inventors: Dennis Lee Matthies, Princeton, NJ (US); Roger Green Stewart, Neshanic Station, NJ (US); James Harold Atherton, Ringoes, NJ (US); Dennis J. Bechis, Yardley, PA (US); Heinz H. Busta, Plainsboro, NJ (US); Zilan Shen, Lawrenceville, NJ (US)

(73) Assignee: Sarnoff Corporation, Princeton, NJ (US)

( * ) Notice: Subject to any disclaimer, the term of this patent is extended or adjusted under 35 U.S.C. 154(b) by 739 days.

(21) Appl. No.: 09/250,324

(22) Filed: Feb. 16, 1999

Related U.S. Application Data
(60) Provisional application No. 60/074,922, filed on Feb. 17, 1998.

(51) Int. Cl.$^7$ ................................. G09G 5/00
(52) U.S. Cl. ................. 345/204; 345/74; 345/77; 345/80; 345/147; 345/205; 345/206; 345/211; 345/212; 345/214; 348/383
(58) Field of Search .................. 345/74, 77, 80, 345/147, 204, 205, 206, 211, 212, 214; 348/383

(56) References Cited

U.S. PATENT DOCUMENTS

| | | |
|---|---|---|
| 3,828,215 A | 8/1974 | Bilsback |
| 3,855,499 A | 12/1974 | Yamada et al. |
| 4,006,383 A | 2/1977 | Luo et al. |
| 4,155,030 A | 5/1979 | Chang |

(Continued)

FOREIGN PATENT DOCUMENTS

| | | |
|---|---|---|
| JP | 53-112085 | 9/1978 |

OTHER PUBLICATIONS

G Mueller, R. Mach, G. U. Reinsperger, L. Schrottke; "Tiling Thin–Film Electroluminescent Displays," SID 91 Digest, pp 567–570.

(Continued)

*Primary Examiner*—Bipin Shalwala
*Assistant Examiner*—Vincent E. Kovalick
(74) *Attorney, Agent, or Firm*—William J. Burke

(57) ABSTRACT

A tiled display device is formed from display tiles having picture element (pixel) positions defined up to the edge of the tiles. Each pixel position has an organic light-emitting diode (OLED) active area which occupies approximately 25 percent of the pixel area. Each tile includes a memory which stores display data, and pixel driving circuitry which controls the scanning and illumination of the pixels on the tile. The pixel driving circuitry is located on the back side of the tile and connections to pixel electrodes on the front side of the tile are made by vias which pass through portions of selected ones of the pixel areas which are not occupied by the active pixel material. The tiles are to formed in two parts, an electronics section and a display section. Each of these parts includes connecting pads which cover several pixel positions. Each connecting pad makes an electrical connection to only one row electrode or column electrode. The connecting pads on the display section are electrically connected and physically joined to corresponding connecting pads on the electronics section to form a complete tile. Each tile has a glass substrate on the front of the tile. Black matrix lines are formed on the front of the glass substrate and the tiles are joined by mullions which have the same appearance as the black-matrix lines. Alternatively, the black matrix lines may be formed on the inside surface of an optical integrating plate and the tiles may be affixed to the integrating plate such that the edges of the joined tiles are covered by the black-matrix lines. A cathodoluminescent tile structure is formed from individual tiles that have multiple phosphor areas, a single emissive cathode and horizontal and vertical electrostatic deflecting grids which deflect the electron beam produced by the single cathode onto multiple ones of the phosphor areas.

28 Claims, 12 Drawing Sheets

U.S. PATENT DOCUMENTS

| | | |
|---|---|---|
| 4,206,460 A | 6/1980 | Yasuda et al. |
| 4,266,223 A | 5/1981 | Frame |
| 4,368,467 A | 1/1983 | Unotoro et al. |
| 4,471,263 A | 9/1984 | Harvey |
| 4,508,990 A | 4/1985 | Essinger |
| 4,528,480 A | 7/1985 | Unagami et al. |
| 4,554,485 A | 11/1985 | Yamada |
| 4,603,280 A | 7/1986 | Pankove |
| 4,613,793 A | 9/1986 | Panicker et al. |
| 4,713,579 A | 12/1987 | Miura |
| 4,757,235 A | 7/1988 | Nunomura et al. |
| 4,792,500 A | 12/1988 | Kojima |
| 4,818,914 A | 4/1989 | Brodie |
| 4,843,280 A | 6/1989 | Lumbard et al. |
| 4,908,539 A | 3/1990 | Meyer |
| 5,015,912 A * | 5/1991 | Spindt et al. ............... 313/495 |
| 5,075,595 A | 12/1991 | Kane |
| 5,095,248 A | 3/1992 | Sato |
| 5,099,301 A | 3/1992 | Kikinis |
| 5,153,483 A | 10/1992 | Kishino et al. |
| 5,156,924 A | 10/1992 | Taniguchi et al. |
| 5,179,316 A | 1/1993 | Kellam |
| 5,206,749 A | 4/1993 | Zavracky et al. |
| 5,256,469 A | 10/1993 | Cherukuri et al. |
| 5,260,698 A | 11/1993 | Munetsugu et al. |
| 5,277,724 A | 1/1994 | Prabhu |
| 5,281,805 A | 1/1994 | Sauer |
| 5,283,500 A | 2/1994 | Kochanski |
| 5,302,966 A | 4/1994 | Stewart |
| 5,317,236 A | 5/1994 | Zavracky et al. |
| 5,336,879 A | 8/1994 | Sauer |
| 5,347,201 A | 9/1994 | Liang et al. |
| 5,347,292 A | 9/1994 | Ge et al. |
| 5,371,434 A | 12/1994 | Rawlings |
| 5,378,963 A | 1/1995 | Ikeda |
| 5,384,517 A | 1/1995 | Uno |
| 5,402,041 A | 3/1995 | Kishino et al. |
| 5,534,743 A | 7/1996 | Jones et al. |
| 5,644,327 A * | 7/1997 | Onyskevych et al. ......... 345/80 |
| 5,661,531 A | 8/1997 | Greene et al. |
| 5,668,569 A | 9/1997 | Greene et al. |
| 5,694,155 A * | 12/1997 | Stapleton et al. ............ 345/206 |
| 5,703,394 A * | 12/1997 | Wei et al. ................... 257/433 |
| 5,739,545 A | 4/1998 | Guha et al. |
| 5,739,800 A | 4/1998 | Lebby et al. |
| 5,745,093 A | 4/1998 | Tsuzuki et al. |
| 5,764,209 A | 6/1998 | Hawthorne et al. |
| 5,771,039 A | 6/1998 | Ditzik |
| 5,796,375 A * | 8/1998 | Holloman ..................... 345/75 |
| 5,805,117 A * | 9/1998 | Mazurek et al. ............. 348/383 |
| 5,818,404 A | 10/1998 | Lebby et al. |
| 5,847,783 A * | 12/1998 | Hiramoto et al. ........... 345/205 |
| 5,867,236 A | 2/1999 | Babuka et al. |
| 5,940,142 A * | 8/1999 | Wakitani et al. ............. 348/671 |
| 5,989,945 A | 11/1999 | Yudasaka et al. |
| 6,005,649 A | 12/1999 | Krusius et al. |
| 6,057,821 A * | 5/2000 | Hughes et al. ................. 345/97 |
| 6,057,898 A | 5/2000 | Itoh et al. |
| 6,100,861 A | 8/2000 | Cohen et al. |
| 6,314,483 B1 | 11/2001 | Goto et al. |
| 6,339,414 B1 | 1/2002 | Todokoro et al. |

OTHER PUBLICATIONS

S.C. Thayer, "Late–News Paper: Modular Wall–Size IC–Driven Flat–Panel Displays," SID 92 Digest, pp. 950–953.

N. Mazurek, T. Zammit, "A 51–in.–Diagonal Tiled LCD VGA Monitor," SID 93 Digest, pp. 614–617.

S. C. Thayer, "Active–Driven TFEL Displays Using Ceramic Tiling," SID 93 Digest, pp. 618–621.

A.N. Prabhu, et al. Co–Fired Ceramic On Metal Multilayer Circuit Board Technology for Multichip Module Packaging.

* cited by examiner

TILED ELECTRONIC DISPLAY STRUCTURE

This patent application claims the benefit of priority from U.S. Provisional application No. 60/074,922 filed Feb. 17, 1998.

BACKGROUND OF THE INVENTION

The present invention concerns electronic display devices and, in particular, large-area display devices which are formed as an array of tiled display devices.

There is an unmet need for large-area flat displays. No clear solution is apparent in the market place. This unmet need is becoming increasingly critical since the advancement of information results in increasing amounts of data to be displayed. A solution for large-area displays is needed to serve as the human interface for conveying information from sensors, computers, data bases, cameras etc. in this information dominated age. Many critical applications demand large-area displays:

Home theater applications

Applications that require multiple viewers

Applications in which the user needs to move about in an area

Applications where simulation of the real world is needed for training.

The requirements for each application differs in size, shape, total number of picture elements (pixels), and brightness. Requirements that are common to most applications include, a relatively large number of pixels, color, ruggedness, portability (minimum thickness and weight), reliability, low power, and affordable cost. A good display solution does not exist for these needs using present technology.

There are fundamental technical issues that impose scaling-laws and limit the size of displays that can be manufactured. These fundamental limitations are one reason why a technical solution that meets the need for large-area displays has not been achieved.

One measure of the complexity of a display device is its total number of pixels. The evolution of display technology has made newer and more complex pixel formats possible—VGA, SVGA, XGA, SXGA. Increased complexity typically is accompanied by added costs. The underlying cause of this empirical complexity law is yield losses caused by random material or particle defects. These defects cause manufacturing yields to diminish as the number of pixels in the display increases.

The measure of size of the display is its area. Costs increase rapidly with size. Each technology, LCD, PDP, EL, etc., has its own limit on maximum size. The underlying technical cause of this empirical relationship is tolerance. It is desirable to hold tight tolerances in manufacturing displays because, as the size increases, the effects of thermal expansion, humidity, residual stresses, and physical sag become more important.

Building a large-area display out of smaller tiles has been recognized as a desirable solution. Tiling is an approach that provides great flexibility for size and shape. Tiling is not subject to many of the problems that limit the size of monolithic display technologies. The basic unit of manufacture in tiled displays is less complex than a large, monolithic multi-pixel display. The size law is not a limiting factor because the basic unit of manufacture is relatively small. This fundamentally different scaling behavior is one advantage of tile technology. It reduces manufacturing costs.

No practical tiled display system has yet been developed (video walls formed by abutting conventional CRT displays are not considered tiled because of their wide separations between adjacent displays). What has been missing is a fabrication technology that allows a display to be constructed so that pixels can be brought up to the very edge (actually, with in ½ pixel spacing period of the edge), while at the same time allowing for electronics to address each tile, even those tiles completely surrounded by other tiles. Two barriers to implementing the tiled approach have been: 1) eliminating the visibility of the seams between tiles, and 2) providing electrical access to the pixels.

One type of tiled display is disclosed in U.S. Pat. No. 5,644,327 entitled TESSELLATED ELECTROLUMINESCENT DISPLAY HAVING A MULTILAYER CERAMIC SUBSTRATE to Onyskevych et al., which is incorporated herein by reference for its teaching on tiled displays. This patent describes an electroluminescent display and a combination field emissive and electroluminescent display which are formed as tiles that may be joined together to provide a large-area display device. The exemplary tiles are formed using low-temperature cofired ceramic and metal structures consisting of multiple layers of ceramic circuit-board material laminated to a metal core.

Driving circuitry for the displays is mounted on the back of the structures and vias are passed through the structure from the back to the front in order to make connection with the pixel electrodes on the front of the display device. The vias that make these connections pass between pixel positions on the display. In addition, connections are made on a pixel-by-pixel basis or for a small group of pixels. Thus, a display device according to the referenced patent may need a relatively large number of vias. The described tiles include connectors at their edges through which multiple tiles may be interconnected.

SUMMARY OF THE INVENTION

The present invention is embodied in an improved tiled display structure. According to one aspect of the invention, the picture element (pixel) structure on each tile has a relatively small active region such that an electrical via may be formed within the pixel area without interfering with the active region of the pixel.

According to another aspect of the invention, the active region of each pixel is offset from the center of the pixel area in at least one of the horizontal and vertical directions such that connecting vias may be formed through pixels along at least one edge of the tile.

According to yet another aspect of the invention, the active area of each pixel is centered in the pixel area.

According to another aspect of the invention, each tile includes a display section and an electronics section and the connecting vias are coupled to connecting pads on the back side of the display section, the connecting pads being arranged to couple with corresponding connecting pads on the front side of the electronics section.

According to yet another aspect of the invention, each connecting pad is electrically coupled to one row electrode or one column electrode at a plurality of respectively different locations.

According to another aspect of the invention, each tile includes circuitry which receives image data and timing information and which stores the received image data for display.

According to another aspect of the invention, this circuitry also compensates for luminance chromaticity non-uniformities in the tile and among the tiles of the display.

According to yet another aspect of the invention, each tile includes circuitry which periodically adjusts the values which compensate for the luminance and chromaticity nonuniformities to compensate for changes in the operational characteristics of the tile over time.

According to another aspect of the invention, the tiles use a block-wise passive addressing technique.

According to yet another aspect of the invention, the pixels on the tile are organic light emitting diodes (OLEDs).

According to another aspect of the invention, the tiles are rigidly coupled to a backpanel structure which provides operational power and data to the tiles and which holds the tiles in position to form a large area display.

According to yet another aspect of the invention, the tiles are physically arranged in a spring-loaded frame which provides operational power and data to the tiles via a flexible connector.

According to another aspect of the invention, each tile includes an electrical connection to receive operational power and an optical connection to receive image data.

According to another aspect of the invention, the frame which holds the tiles to form the large area display includes an optical integrating structure having dark stripes that define a matrix of transparent cells and each tile is mounted in the integrating structure such that each of its active areas is aligned with a respective one of the transparent cells of the optical integrating structure.

According to yet another aspect of the invention, the optical integrating structure includes mullions, coincident with at least a portion of the dark stripes, the mullions defining respective sub-areas on the optical integrating structure into which respective tiles are placed, to mount the tiles to the optical integrating structure.

According to another aspect of the invention, each of the mullions has a "T" shaped cross section and the top surface of the mullion is the same color as the dark stripes while the vertical bar of the mullion is transparent.

According to another aspect of the invention, each of the mullions has a "T" shaped cross section and the top surface of the mullion is the same color as the dark stripes while the vertical bar of the mullion is a color having a reflectivity which approximates the composite reflectivity of the materials which form the tiles.

According to another aspect of the invention, the tiles are respective cathodoluminescent devices having a single cathode which may be controlled to illuminate a plurality of respectively different phosphors.

DETAILED DESCRIPTION

Figure 1:
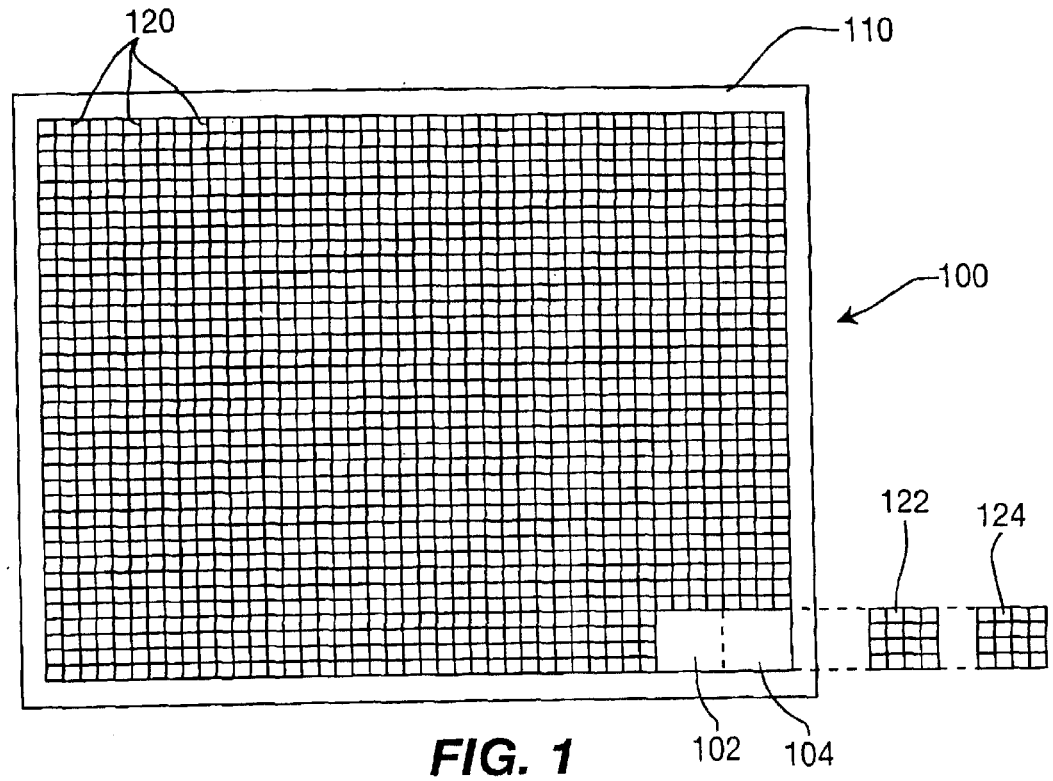
FIG. 1 is a front plan drawing of a large area display device from which two tiles have been removed.

The invention is described in terms of exemplary embodiments which are illustrated in the drawing figures. The drawing figures are not to scale. Indeed, dimensions of the drawing figures are exaggerated to aid in the description of the invention. Although the invention is described in terms of an optical light emitting diode (OLED) display device, it is contemplated that it may be practiced with other emissive display technologies such as electroluminescent, light emitting diode (LED) or plasma technology; or with reflective display technologies such as Bistable, Reflective Cholesteric (BRC) liquid crystal technology.

FIG. 1 is a front plan view of a partially assembled large-area display 100 according to the present invention. The display 100 is a tiled display in which emissive or reflective elements, on which the image pixels are formed, are built as relatively small arrays on tiles 120 and assembled into a frame to produce the large-area display having a large number of pixel forming elements. Alternatively, the tiles may be assembled side-to-side with their pixels aligned in rows and columns without a frame. In this instance, the individual tiles may be held together by mullions.

The tiles are constructed with pixel forming elements evenly spaced up to the edges of the tiles. As described below with reference to FIGS. 15 through 19, the tiles are formed such that, when they are joined, the inter-pixel distance between the edge pixels of two adjacent tiles is the same as the inter-pixel distance of adjacent pixels in the interior of a tile. The display shown in FIG. 1 is missing two tiles 122 and 124. These tiles are inserted into the positions 102 and 104 to complete the display.

Although the display 100 is shown as being formed from tiles having 16 pixel forming elements in a four by four array, it is contemplated that each tile may include many more pixels. In one exemplary embodiment of the invention, described below, each tile includes 896 pixel forming elements arranged as a 32 by 28 matrix. These tile sizes are only exemplary. It is contemplated that each tile may include more or fewer pixel forming elements. In addition, it is contemplated that a single display may be formed from tiles having differing numbers of pixel forming elements. For example, a display may have tiles with relatively large numbers of pixel forming elements near the center and tiles having relatively small numbers of pixel forming elements near the edges.

Figure 1A:
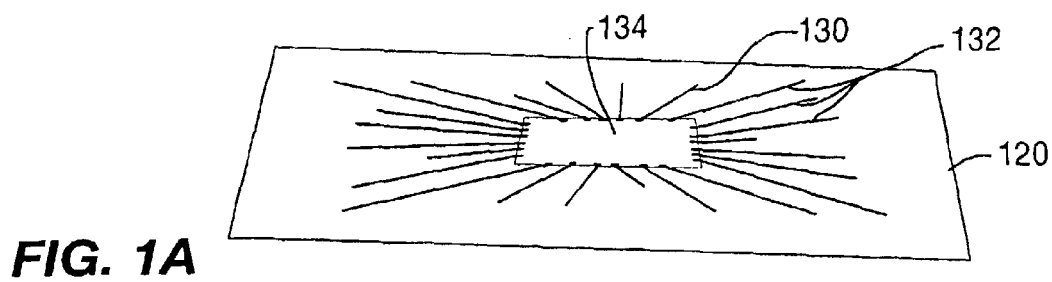
FIG. 1A is a perspective drawing of the back side of a tile suitable for use in the large area display shown in FIG. 1.
Figure 1B:
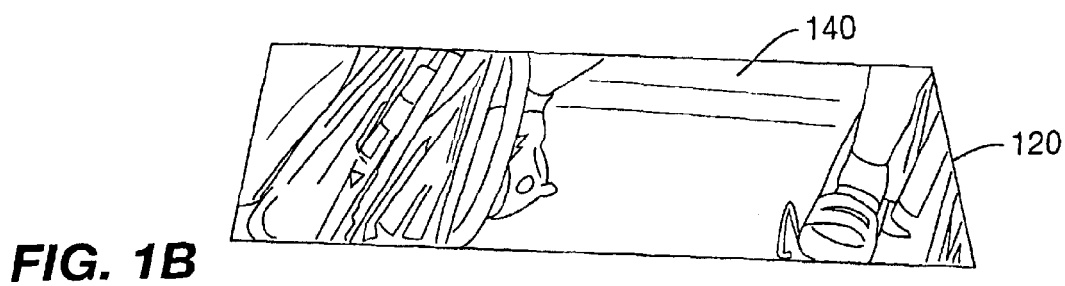
FIG. 1B is a perspective drawing of the front side of a tile suitable for use in the large area display shown in FIG. 1.

FIGS. 1A and 1B are perspective drawings showing the back and front surfaces of an exemplary tile 120. As shown in FIG. 1A, the tile includes a circuit board 130 on which is mounted at least one integrated circuit 134. The integrated circuit is connected to the pixel forming elements through conductive traces 132 on the circuit board which are coupled to vias (not shown) that extend through the circuit board to make contact with the row or column electrodes of the display device. In the tile shown in FIG. 1A, vias extend through the pixel forming elements internal to the display area, as described below with reference to FIGS. 9, 10A and 10B. Alternatively, the vias may extend through pixel forming elements along two edges of the display, as described below with reference to FIGS. 5 through 6A.

In one exemplary embodiment of the invention, the pixel forming elements are made from an organic light emitting diode (OLED) material. The basic light emitting structure consists of a thin organic polymer layer sandwiched between a pair of appropriately selected and patterned electrodes. Current flowing from one electrode to the other electrode causes the organic polymer to emit light. At least one of the electrodes is desirably transparent to the emitted light. Indium tin-oxide is the usual material used for this purpose. OLED materials provide high brightness and high efficiency, and are relatively low cost materials.

An exemplary display structure according to the present invention is formed in two parts: a display section and an electronics section. These two parts are made separately and then joined to form a complete tile. The display section consists of a transparent glass layer on which are transparent column electrodes are deposited. The OLED material is deposited onto these layers, as the active (i.e., light emitting) medium. Row electrodes are deposited as the final display layer. Additional layers such as blocking or passivation layers may be present to improve the function or life of the display layers. The transparent electrode is preferably the hole injecting electrode and the other electrode is preferably the electron injecting electrode. The OLED materials between the electrodes are preferably conjugated polymer materials that are applied by thick film processes, however, small molecule materials can alternatively be applied by various thin film deposition techniques. The layers are patterned so that there is electrical access to each row and column at one or more points.

As an alternative to the OLED materials, the pixel forming elements of the tiles may be any of a number of emissive devices such as electroluminescent elements, light emitting diodes, field emissive elements, plasma elements or cathodoluminescent elements.

The electronics section is formed by punching or drilling vias through the circuit board and then printing or otherwise depositing the conductive traces on the circuit board. The conductive ink or paste used to form the conductive traces may also fill the vias. The vias make contact with the row and column electrodes of the display section when the electronics section and the display section are joined to form a tile.

Although it is not illustrated, another exemplary embodiment of the present invention includes a pixel forming structure that is appropriate for applications in which either a reflective or low power display is needed. The substrate and the electronics of this new structure are essentially the same as described below for the OLED embodiments. The display layer in this alternative embodiment, however, is a reflective display material. For example, a Bistable, Reflective Cholesteric (BRC) liquid crystal material which provides for a low power, bistable display. The disclosed tile structure enables, for the first time, video-rate displays in large area BRC displays. These materials switch between a planar, reflective state and a relatively transparent focal conic state. Utilizing a black backing, these two states may appear colored and black. The BRC materials offer distinct advantages for large area tiled displays: the operation between a reflecting and transparent state, combined with a black back-plane makes possible bright, high contrast displays under a variety of lighting conditions; and the bistability also allows for maintaining static images with no power applied.

One exemplary tile structure consists of a multilayer ceramic circuit board 132 that serves as a substrate upon which: the display material is mounted on the viewer side while the electronics 134 (active and passive) for drive or other functions are mounted mostly on the back side. Conductor elements 132 are printed on the individual layers to provide interconnections between the electronics and the display material, vias interconnect the conductors in different layers; and connectors are provided on the back surface to connect to external power and signal sources. The tile structure may also have a structural layer(s) such as a high softening point metal or insulator to provide freedom from distortion during the processing of the ceramic materials, and/or thermal management during the operation of the display. The tile structure also contains a transparent layer (e.g. float glass) on the viewer surface to protect or contain the display material. A back panel structure is provided to mount the individual tiles and to provide electrical connection to the power and drive signals needed by each individual tile structure.

The Multilayer ceramic circuit board 130 may be formed of layers of ceramic material. The layers are first formed and processed to form vias, conductors, and other features and then assembled in a stack taking care to carefully align each layer with those layers adjacent to it. Ceramic material here is meant in the broadest sense to include ceramics, glass ceramics, glass, and other high temperature insulating materials. The multiple layers together with the connectors and vias provide the basic function of a circuit board upon which active and passive electrical devices and circuits can be placed.

The conductors 132 may be thin and/or thick film conductors formed by any of the standard processes including, for example plating, evaporation, sputtering, printing and laminating. The materials may be metals or organic conductors. The conductors may be patterned by processes that may include, for example, printing or photolithography. These conductor patterns are formed on the surfaces of the individual layers in the disclosed structure and connect to the vias to provide, according to the design of the device a means of interconnecting the electronics on and external to the disclosed structure to the display material.

Another class of conductors are used to interconnect the layers. These conductors are called vias. Via is used in the broadest sense and includes conductors that go through openings in the layer and those that go around the edge of a layer(s). Vias that go through a layer can be formed, for example, by making a hole in the layer and filling that hole with a conductor. Alternatively, pre-formed physical conductors may be imbedded in the layer. Vias that go over the edge of a layer(s) can be formed by physically placing a wire (round or flat), or array of wires, and wire bonding the ends to the surfaces to be interconnected. Alternatively they can be formed in place by plating or other fabrication process for thick or thin film conductors.

A core layer may also be included in this structure. This layer typically has a higher softening point than the ceramic materials and serves as a substrate for the assembly and processing of the ceramic material. The core layer acts to: eliminate horizontal shrinkage; establish a single coefficient of expansion for the multilayer system, and provide mechanical ruggedness to the multilayer assembly. If the layer is a good electrical conductor it may also provide RF shielding. If the layer is also a good thermal conductor, it contributes to the thermal management of the display. Conductive layers, however, present a special problem for via connections. Via connections through metal layers can be fabricated in several ways: filling the periphery of the hole with an insulating material before putting a metal conductor through the middle, or by putting the conductor only through the middle leaving space separating the conductor from the conductive metal core.

The electronics which form the image processing and pixel driving circuitry are mounted on the layers. Electronics are used in the broadest sense to include both active and passive, and both discrete devices mounted on the layers and devices formed in place by processes such as those now used to make active matrix circuits for displays on various high temperature substrates. While these electronics can be placed anywhere, the most convenient location is the back surface. This permits standard assembly and attachment equipment and processes to be used. In addition, the placing of active or passive devices on the intervening layers or viewer surface permits greater flexibility in the system design.

The display material is applied to the surface visible to the viewer. Because of the flexibility of the construction of the disclosed structure, different display materials can be used.

The edges of the tiles are desirably carefully formed to ensure that the tiled display has no visible seams between the tiles. One criterion for the tiles is that the spacing between the pixels separated by the tile seam is the same as the spacing of pixels on the tile. To satisfy this criterion, the tile edges are desirably dimensionally precise. Furthermore, if the edges are also used for conductors or if mullions are used to join adjacent tiles, it is desirable to account for the thickness of these conductors or mullions in the design and placement of the tiles.

A backpanel may be provided for the physical mounting and interconnection of the tiles to form a display. The mounting of the tiles is done such that there is a continuity in the pixel spacing over the display. The shape of the tiles is most typically square or rectangular, however the shape can be any shape that can be tiled to form a larger display. Also, the tile is typically flat, but may be curved along one or both dimensions to form curved or domed displays. Curved or domed displays can also be made using flat tiles mounted on a curved or domed backpanel. Tiles may be attached to the backpanel either by permanent connection such as soldering or using connectors which allow the tiles to be plugged into the backpanel. This latter method permits the repair and replacement of individual tiles. Different types of tiles may be attached to different areas of the backpanel—for example, higher resolution areas may be placed in the center or other areas of the large display. In addition, different sized or different shaped tiles may be combined in a single display. For example, tiles near the edges of a large panel may be larger and have a lesser pixel density than tiles near the center of the panel. Tiles may also be slightly undersized relative to their pitch on the backpanel to leave gaps between them and facilitate accurate placement.

The back panel may also provide the means for connecting the tiles to the operational power and data signals needed to operate the tile. Matching connectors may be provided on both the backside of the tile and the backpanel to provide this connection. In the case of the data signal connections, optical connection may be used as an alternative to physical connection.

The electrical structure of the backpanel provides for the distribution of power and signals to the tiles, and the electrical structure of the tiles provide for the addressing of the display pixels. Both levels of structure are described. The information needs of a tiled display increase with the size of the display as measured in total number of pixels. A greater number of pixels on a tile translates to greater amounts of data stored on the tile and greater rates of information transfer.

One advantage of the tiled display is that the scan electronics can be internal to the tile and the scan rate of any one tile is the same for a small display or for a large display. This ensures that the brightness and gray scale of the display do not degrade with increasing size. The tiled displays described in detail below have an architecture which connects the signals to the pixels without interrupting the continuity of the pixel spacing, even at the edges of the tiles. The disclosed tiled displays may also have signal processing circuitry which extracts the signal information for that tile from a broadcast information signal and transforms the extracted information into the signals needed to address that tile.

In general, the front-to-back connections include one for each row of pixels and one for each column of pixels on the tile. Tiled displays have relatively few pixels so that the number of interconnects per tile is relatively small and the yield on individual tiles can be high. This is a significant advantage of tiled displays when compared to fabrication of large displays from single substrates. In general, the yield is a function of the number of pixels in the display device.

The final connection to the row or column is made with a via that extends from the back surface of the tile. This via has a diameter less than the spacing of a pixel. To accomplish this, the portions of the vias in the display layer(s) may be made smaller than the vias through the other intervening layers, and, as described below, the connections may be staggered over the area of the tile to provide maximum spacing between the wider interconnects. These connections are the final link in the distribution of the display signals to the pixels.

Figure 2:
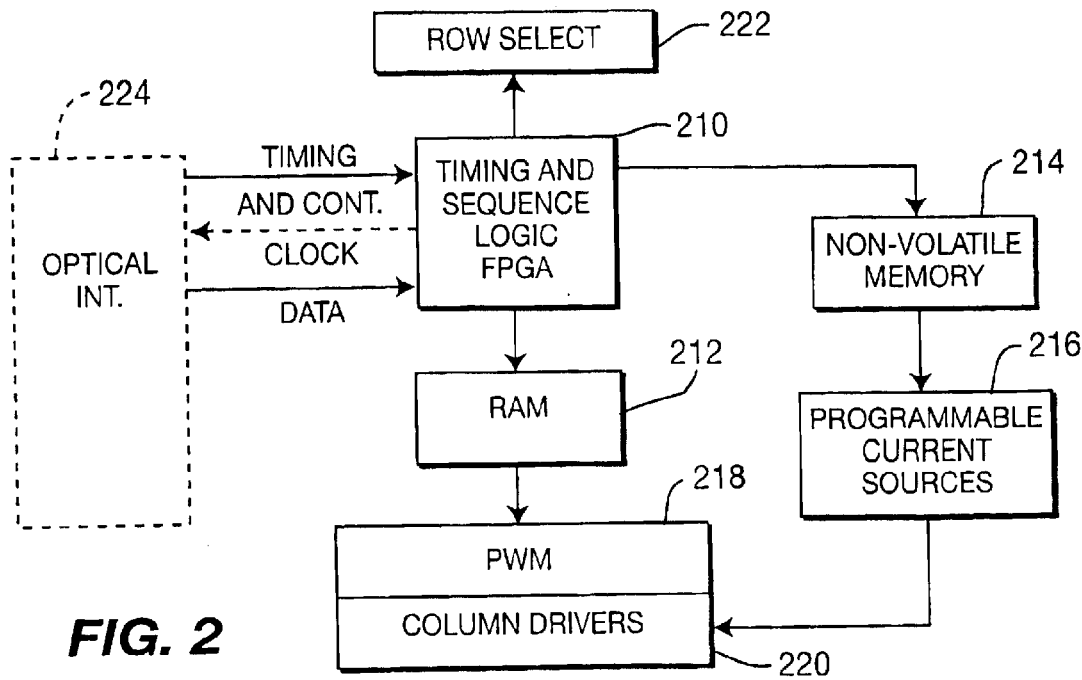
FIG. 2 is a block diagram of image processing and driving circuitry suitable for use in the tile shown in FIGS. 1A and 1B.

FIG. 2 is a block diagram of electronic circuitry which is suitable for use with a display tile according to the present invention. For the sake of clarity, the operational power connections (e.g. power and ground) are not shown in FIG. 2.

As shown in FIG. 2, a field programmable gate array (FPGA) 210 which comprises the timing and sequence logic receives a timing and control signal and a data signal. As described below, these signals may be provided to the tile by an electrical wiring harness or through an optional optical interface 224 (shown in phantom). The timing and control signal includes a system clock signal, a synchronization signal and control values which may change the functions performed by the display electronics. When the optical interface 224 is used to receive the data signal and the timing and control signal, the timing and sequence logic circuitry 210 may provide a clock signal, CLOCK, to the optical interface 224.

The circuitry shown in FIG. 2 may be viewed as having four functions: loading and storing compensation data for an individual tile, loading and storing display data for the tile, displaying the stored data, and adjusting to compensate for changes in the brightness performance of individual pixels.

In the exemplary embodiment of the invention, each tile may be separately compensated to ensure that all tiles display pixels having a uniform brightness with uniform colors. The exemplary method for compensating the tiles is described in terms of an OLED display material. It is contemplated, however, that a similar method may be used with other types of emissive and light modulating display materials.

The level of light emitted by a particular OLED pixel is a function of the level of current provided to that pixel. Thus, the brightness of each pixel in the display is controlled by controlling the magnitude of current that is supplied to that pixel during normal operation. In the exemplary embodiment of the invention, each pixel is either turned on or off. Gray scale is achieved by changing the relative amount of time that one pixel is turned on. The amount of light emitted by a pixel when it is turned on is controlled by controlling the level of current applied to the pixel in the on state. In the exemplary embodiment of the invention, the level of current applied to each pixel may be adjusted to match the amount of light emitted by the pixel to the amounts of light emitted by every other pixel in the display device. The pulse width of the pulse which drives the pixel is changed to modulate the brightness of the pixel when an image is being displayed on the tile.

The exemplary embodiment of the invention employs a passive addressing technique within a block in which only one row of pixels is illuminated at any time. The scanning circuitry steps through each row on the tile and illuminates that row for a predetermined interval. Because each tile is individually scanned, all of the tiles may illuminate a row simultaneously. Thus, each time a single tile refreshes its pixels, the entire display device also refreshes its pixels. To minimize display artifacts, it may be desirable to synchronize the scanning signals used by the tiles. For example, it may be desirable to use the same scan timing for all tiles on a row to minimize apparent differences between tiles on the row. In addition, it may be desirable to synchronize all of the tiles on the display to have the same scan timing. In this instance, immediately after one row of tiles completes its scan, the next row of tiles begins its scan. Thus, the scan line appears to move uniformly down the display device while other scan lines are also moving down the tiled display device. In this configuration, the display device would appear to have a number of scan lines equal to the number of rows of addressing blocks in the device. The row selection circuitry 222 may be, for example, a conventional clocked shift register having a number of stages equal to the number of rows in the addressing block. The shift register clocks a single logic-high value through the rows of the addressing block. As the logic-high value is applied to each row, the pixels in that row are selected.

Referring, again, to FIG. 2, the current applied to a pixel cell on the display device is controlled responsive to a value for the pixel cell that is stored in the non-volatile memory 214. As each line of pixels on the tile is addressed, the addresses of the pixels on the line are applied to the memory 214, which provides a number of compensation values to the programmable current sources 216. The number of values provided equals the number of columns in the display device. Each value is applied to a respectively different programmable current source to provide respective current values to the pixels in the selected row. Thus, as shown in FIG. 2, the programmable current sources are coupled to the column drivers 220. When the column drivers are enabled, they each provide a level of current determined by a respective one of the programmable current sources 216.

As described above, the display of pixel data is controlled by pulse-width modulating the current signals provided to the selected row of pixels. In the exemplary embodiment of the invention, a random access memory 212 stores a number of pixel values which may, for example, correspond to the number of pixels on the tile. When the tile is to display a line of data, the timing and sequence logic 210 selects a row, fetches the line of data corresponding to the selected row and applies the selected data to the pulse width modulator (PWM) 218. The PWM 218 converts the binary values into respective pulse widths and controls the column drivers to apply the current levels provided by the programmable current sources 216 to the column electrodes of the tile. Because only one row is selected, these current values flow through the display materials only on the one row, causing the row to emit light. The memory 212 may hold more or less data than would be required to operate the number of pixels on the tile. If the memory holds less data, then new data may need to be stored into the tile while previously stored data is being displayed. If the memory 212 holds more data, then the circuitry shown in FIG. 2 may display image data for a row of pixels from one image frame while a row of data from the next image frame is being loaded into the memory 212. In general, it is contemplated that the various functions performed by the electronic circuitry shown in FIG. 2, loading compensation data, loading pixel data and displaying pixel data may be performed concurrently.

The timing and sequence logic 210 receives the timing and control signal and decodes the control signal to determine which functions are to be performed. During the manufacturing process, each tile may be calibrated to a nominal brightness value by, for example, mounting the completed tile onto a test fixture which has a photocell corresponding to each pixel position. Each pixel is individually turned on and its brightness is compared to the nominal brightness and a control value for the pixel is applied to the programmable current source 216 for that pixel. When the nominal brightness level is reached, the value applied to the current source 216 is stored into the non-volatile memory 214.

The tile may also include circuitry which automatically adjusts the pixel brightness to compensate for aging of the display material. This circuitry may, for example, allow a viewer to display a predetermined brightness value, select an individual tile and adjust the brightness value up or down to match the brightness of the selected tile to match its neighbors. Alternatively, the tile may include a small light sensor over one or more pixel positions which continually monitors the brightness of that pixel and adjusts the current level applied to that pixel—and the current levels applied to all of the other pixels on the display—to compensate for variations in pixel brightness due to aging of the display. To minimize the visibility of the light sensor, it may be placed away from the active pixel area so that it is responsive to scattered light.

Alternatively, the circuitry 134 may include an all electronic compensation system which continually adjusts the brightness of individual pixels to compensate for aging. The inventor have determined that the decay in the brightness of an OLED pixel that occurs with aging can be predicted by measuring the current and time for a particular pixel, and integrating the product of current and time. This product can be fitted to a characteristic curve and used to adjust the drive current to predict a new drive current which restores the original brightness level of the pixel. As a further improvement, it has been found that the rate of decay for different pixels differs slightly, and the initial decay slope can be measured during burn in and used as a second order correction factor in the algorithm for calculating any change in drive current for that pixel. The exact form of this adjustment depends on the geometry of the pixels and the materials that are used to form the pixels. A suitable adjustment may be readily determined by one skilled in the art of designing OLED displays by monitoring the performance of an exemplary pixel over time.

Another method of compensating for loss in brightness due to aging is to monitor the voltage that is applied to the pixel. For example, at time T0, when the brightness level of the pixels is first adjusted, a current I0 at a voltage V0 produces brightness B0. At some later time T2, two changes occur; it now takes voltage V2 to produce the same constant current I0, and the brightness at this I0 is now B2 (B2<B0). The inventors have determined that the change in voltage dV=(V2−V0) is proportional to the change in brightness dB=(B2−B0). Knowing this proportionality constant allows for electronically calculating a new current I2 that will produce the original B0. This algorithm can be incorporated in the electronics on the electronic drive block, and the result is that the brightness can be maintained at constant brightness automatically without manual adjustments. This proportionality constant varies for different pixel geometries and different OLED materials. It can be easily determined by one skilled in the art of designing OLED displays by monitoring the performance of an exemplary pixel over time.

Alternatively, an external system of reestablishing the brightness uniformity may be employed. Such a system may, for example, incorporate a sensor that detects and measures individual pixel brightness and some means to communicate with the display electronics so that the correct drive voltage needed to establish the desired brightness can be stored in the display tile memory.

While specific examples have been given, it is contemplated that any of these methods for adjusting the current applied to a pixel in order to maintain a predetermined brightness level may be combined with any other method either as a check or to augment the performance of the other method.

The exemplary display device calibrates the brightness of the pixels using a method (i.e. current control) which is orthogonal to the method (i.e. pulse-width modulation) which is used to control the pixels to achieve gray scale. This is advantageous as it allows the individual pixels to be calibrated to display brightness levels which are consistent across the entire dynamic range of the display. Minimizing the interaction between the brightness compensation and the image information simplifies the system and improves accuracy.

Figure 3:
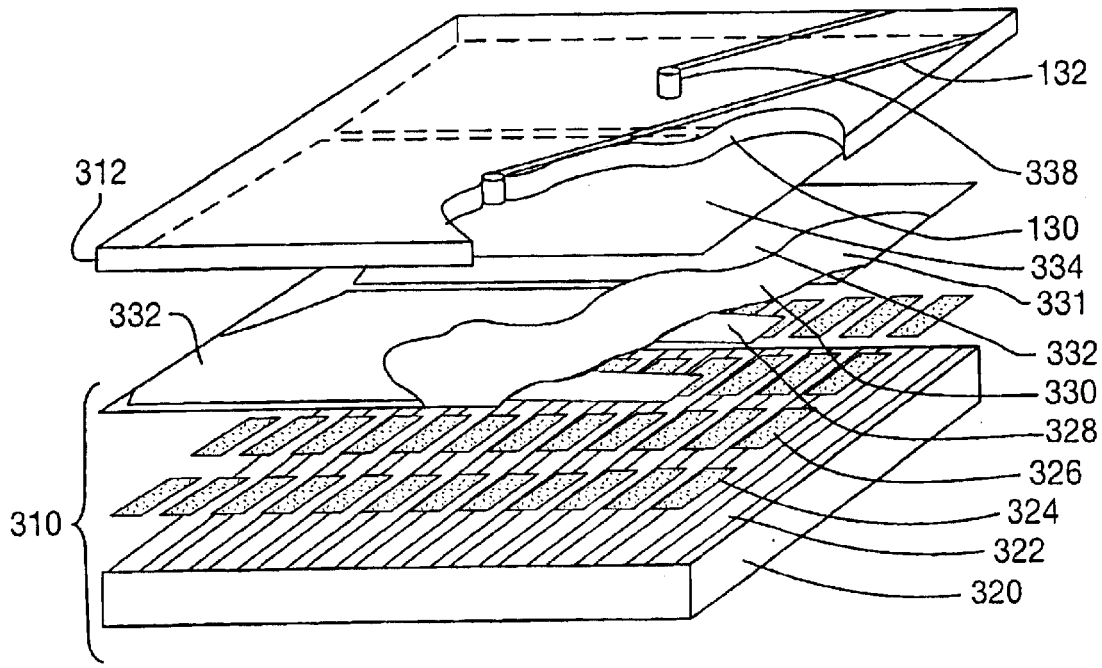
FIG. 3 is an exploded perspective drawing which illustrates a structure that may be used to implement the tile shown in FIGS. 1A and 1B.

FIG. 3 is an exploded perspective diagram which shows a first exemplary tile structure. The tile structure is formed in two parts: the display section and the electronics section.

The display section includes a transparent front plate which may be, for example, a float glass plate. Transparent column electrodes 322 are formed on the front plate 320 by forming thin bands of a transparent conductor, such as indium-tin oxide, using well known processes. This may be done, for example, by depositing a film of ITO over the surface of the float glass plate and selectively etching the ITO to form the electrodes. The display materials, red, green and blue OLED materials 324 and 326, including a hole transport layer, a light emitting layer and an electron injecting layer, are deposited on top of the column electrodes to define the active area of the pixel. The hole transport layer is electrically coupled to the column electrodes, and the light emitting layer is electrically coupled to the hole transport layer. The electron injecting layer which may, for example, be formed from metallic calcium is formed on top of the light emitting layer. The row electrodes 328 are formed on top of the electron injecting layer. As described below with reference to FIGS. 6A and 7, it is desirable for the display materials 324 and 326 to occupy only a portion (e.g. about 25 percent) of the pixel area. The row electrodes may be formed, for example, from polysilicon or from a metal such as aluminum using standard deposition techniques. An insulating layer 330 is formed on top of the row electrodes. The exemplary insulating layer 330 may be formed from any of a number of insulating materials. To protect the display materials, the insulating layer 330 is desirably formed using low-temperature processes. Exemplary materials include Polyimide or other low-temperature inorganic materials. The insulating layer 330 may be applied using thick film or thin film deposition techniques. The insulating layer 330 includes a plurality of openings 331 aligned with the row electrodes 328 or column electrodes 322.

On top of the insulating layer are deposited a plurality of connecting plates 332. The plates 332 may be formed using, for example, vapor deposited aluminum or a metallic ink or paste, such as silver combined with a solvent, which is deposited using thick film processes. As described below with reference to FIGS. 9 through 10B, the connecting plates are coupled to the column electrodes 322 and row electrodes 328 by vias which extend through the openings in the insulating materials. Each of the exemplary connecting plates makes electrical contact with only one row electrode or one column electrode. To ensure that a good connection is made, however, each connecting plate 332 may connect to its corresponding row or column electrode at several locations.

The electronics section 312 includes image processing and display driving circuitry 134 (not shown in FIG. 3) a circuit board 130, which may be, for example, a thin sheet of alumina ($Al_2O_3$), deposited electrical conductors 132, connecting pads 334 and vias 338 which electrically connect the conductors 132 to the connecting pads 334 through the circuit board 130. The conductors 132, vias 338 and connecting pads 334 may all be formed using thick film deposition processes to apply a metallic ink or paste. The connecting pads 334 may also be formed from vapor-deposited aluminum. There is a one-to-one relationship between the connecting pads 334 of the electronics section and the connecting plates 322 of the display section. In the exemplary embodiment of the invention, the connecting pads 334 and the connecting plates 322 are electrically connected by applying an anisotropically conductive adhesive between the display section and the electronics section. The combined display section and electronics section forms a tile 120.

It is contemplated, however, that other methods may be used to electrically connect the connecting pads to their respective connecting plates. For example, the connecting plates 322 and connecting pads 334 may be made from a deformable material and patterned to include a portion which extends above the plane of the pad or plate. When the electronics section is mated to the display section, the patterned material on the connecting plates 322 and connecting pads 334 comes into contact and deforms, forming an electrical connection between the corresponding connecting pads and plates. The pads 334 and plates 322 may also be connected by bump-bonding techniques or using wires that are implanted in one of the pads 334 or plates 322 and engage the plate 322 or pad 334 when the electronics section 312 is mated to its corresponding display section 310.

Figure 4:
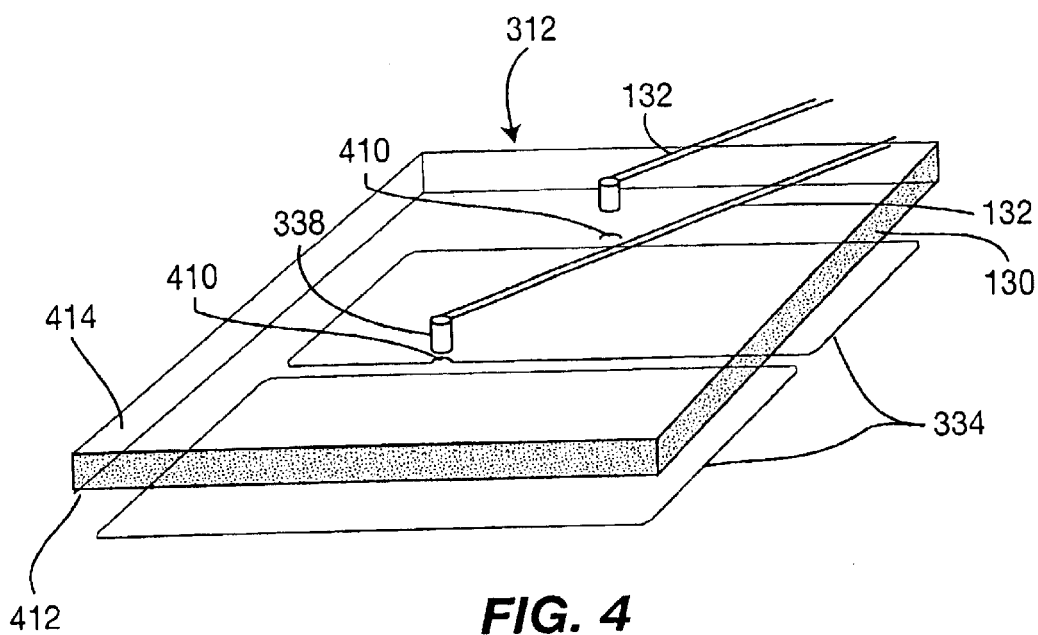
FIG. 4 is an exploded perspective drawing which illustrates the electrical connecting structure of the tile structure shown in FIG. 3.

FIG. 4 is an exploded perspective drawing of a portion of the electronics section 312. This drawing more clearly shows the electrical connecting structures of the electronics section. The circuit board 130 includes a plurality of openings 410 each of which corresponds to a respective connecting pad 334. The vias 338 are formed in the openings 410 at the same time that the connecting pads 334 are formed on the front surface 412 of the circuit board. The electrical conductors 132 are formed on the back surface 414 of the circuit board 130 to connect the image processing and display driving circuitry 134 (not shown in FIG. 4) to the various connecting pads 334.

Figure 5:
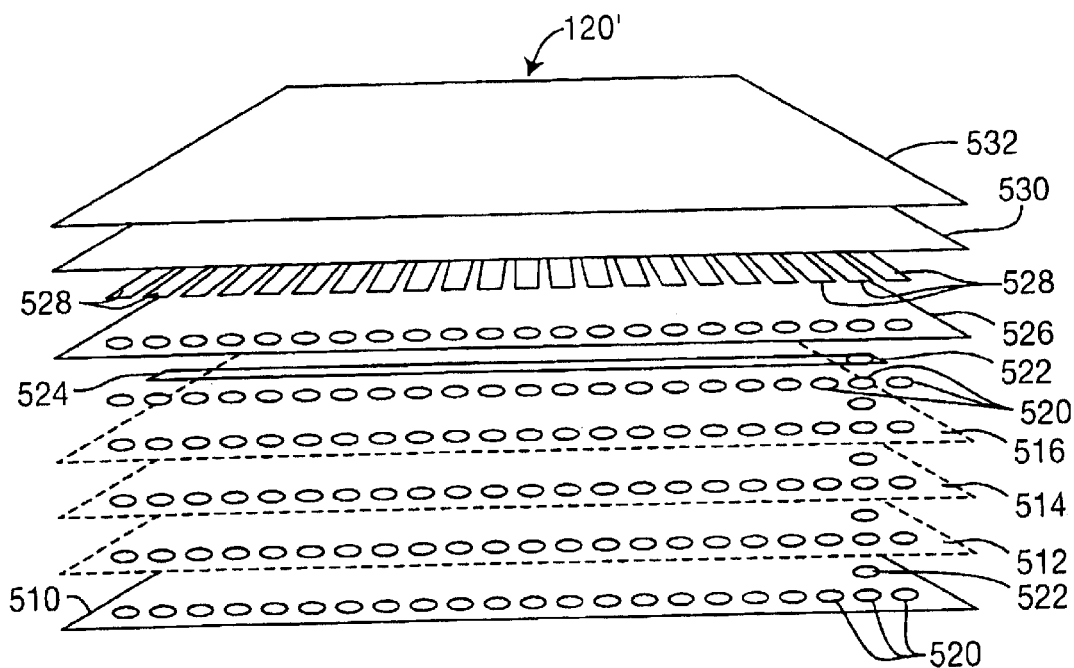
FIG. 5 is an exploded perspective drawing which illustrates an alternative structure that may be used to implement the tile shown in FIGS. 1A and 1B.

FIG. 5 is an exploded perspective drawing which illustrates an alternative structure of an exemplary tile 120. The tile shown in FIG. 5 may be formed as a separate electronics section and display section or it may be formed as a single structure. In addition, the connections to the row and column electrodes of the tile are made along two edges of the tile.

The circuit board for the tile shown in FIG. 5 is the bottom layer 510. This circuit board may include, for example, an electronics module such as the circuit 134 shown in FIG. 1A. The electronics module is coupled to the row and column electrodes of the display device through column vias 520 and row vias 522. Only one row via 522 is shown in FIG. 5. In the exemplary tile shown in FIG. 5, the circuit board is level 510 and optional levels 512, 514 and 516, shown in phantom, are interconnecting layers. These may be ceramic layers having vias to connect to higher layers and conductive traces painted or printed on one surface of the layer. If the tile structure is formed from an LTCCM material, one of the layers 512 or 514 may be a metal or insulating structural substrate. Layer 516 is a ceramic layer having column vias 520 and row vias 522. The row vias formed on the ceramic layer 516 connect to the row electrodes 524 of the exemplary display tile.

If the tile shown in FIG. 5 is formed from separate electronics and display sections, then the electronics section includes only the layer 510 and the optional layers 512, 514 and 516. If the tile is formed as a single piece then the display material 526 is deposited on top of the row electrodes 524. In the drawing FIG. 5, the display material 526 is illustrated as a solid sheet. This material, however, may be individual electron injecting layers and individual OLED cells deposited on the row electrodes. As described above with reference to FIG. 3, the row electrodes may be formed from a metal such as aluminum or from polysilicon.

The column electrodes 528 are formed on top of the display material 526. The column electrodes are connected to the circuit board through the vias 520 which extend through each level of the display tile from level 510 through level 526. Each column electrode is coupled to a respectively different via 520. As in the tile structure shown in FIG. 3, the column electrodes 528 are typically formed from a transparent conductive material such as indium-tin oxide (ITO). In the exemplary embodiment of the invention, level 530, formed above the column electrodes 528 may be an optical filter or it may be a patterned black matrix which covers the inactive areas of the display layer 526 with black lines while providing openings for the active elements of the display material. The final layer of the display tile shown in FIG. 5, is a float glass front cover 532.

If the tile shown in FIG. 5 is formed as separate electronics and display sections, then the display section may be formed, as described above with reference to FIG. 3. First, the filter or black matrix layer 530 is deposited on the float glass cover 532. Next, the transparent column electrodes 528 are deposited, then the OLED materials are formed on the column electrodes and the row electrodes 522 are formed to cover the OLED materials. The exemplary separate electronics and display sections shown in FIG. 5 may be joined by bump-bonding the row and column vias along their edges or by inserting conductive elements, for example wires, into the row and column vias on one of the sections such that the conductive elements protrude from the vias. The conductive elements would then mate with the corresponding vias on the other section when the sections are joined.

The tile structure shown in FIG. 5 may be formed by first preparing green tape blanks for the layers 510, 512, 514 and 516. Next, the blanks are punched with holes through which the vias 520 and 522 will be formed. After the blanks are punched, they may be painted or printed with suitable conductive material to fill in the vias and to provide any conductive traces which may be needed to interconnect other circuitry in the display tile. The traces printed on the green tape sheet 516 may include the row electrodes 524. This structure including layers 510, 512, 514 and 516 as well as the vias 520 and 522 and the row electrodes 524 is then laminated and fired to form a ceramic substrate for the circuit component of the display device. Next, the display materials 526 are deposited on the row electrodes 524. After depositing the display material 526, the column electrodes are formed on the tile using conventional processes for depositing ITO.

In a separate step, the black matrix or filter 530 may be formed on the float glass cover 532. The combined mask and cover is then aligned with the display device such that the openings in the mask correspond to the active pixel regions of the display material. The glass cover 532 is then sealed to the composite fired ceramic structure using, for example, a frit glass.

Figure 6:
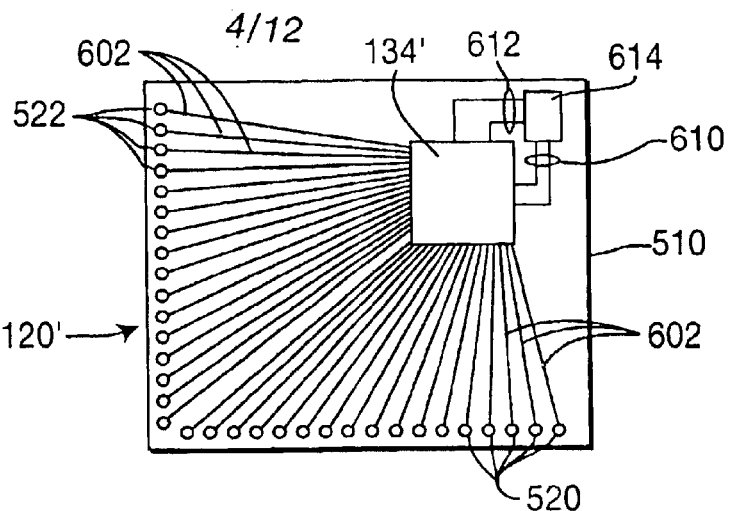
FIG. 6 is a back plan view of a tile having the structure shown in FIG. 5.

FIG. 6 is a bottom plan view of the display tile shown in FIG. 5. As shown in FIG. 6, the circuit board 510 includes electronic circuitry 134' which is connected to the rows and columns of the display through the vias 520 and 522 respectively. In the exemplary embodiment of the invention, the conductors 602 which connect the circuitry 134' to the vias 520 and 522 may be printed or painted onto the green tape prior to firing, as described above. The connectors 602 are coupled to the vias 520 and 522 along the edge of the circuitry 134'. The circuitry 134' is coupled to receive operational power via conductors 610 and to receive the data signal and timing information via conductors 612 and a connector 614. As described below with reference to FIG. 12, the connector 614 may be coupled to a cable harness when the tile 120' is assembled into a tiled display device such as the device 100 shown in FIG. 1.

Figure 6A:
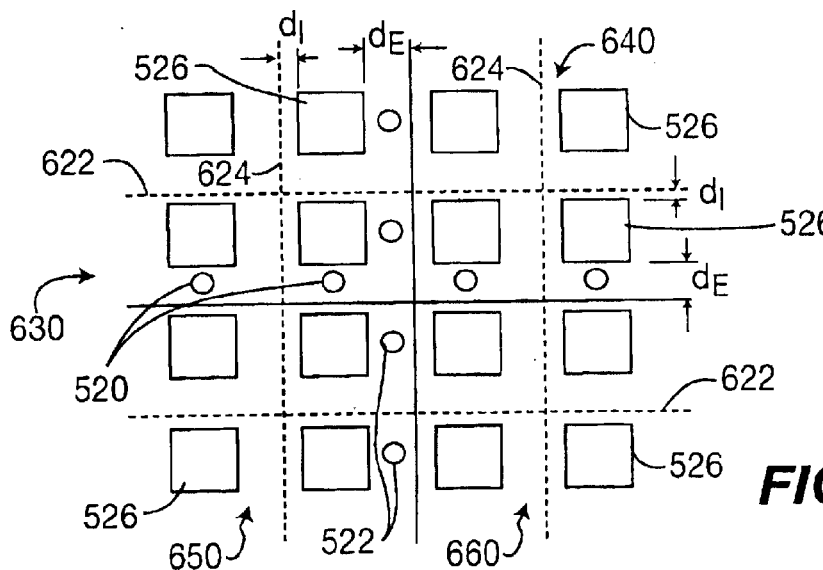
FIG. 6A is a pixel diagram which shows an exemplary pixel layout for portions of four tiles having the structure shown in FIG. 5.

FIG. 6A is a pixel diagram which illustrates an exemplary pixel spacing that may be used in the tile shown in FIG. 5. This pixel spacing allows the conductive vias to be arranged along the edge of the tile, without locally distorting the inter-pixel distance in the assembled tiled display. FIG. 6A illustrates portions of 4 tiles, 630, 640, 650, and 660. The dashed lines 624 and 622 illustrate pixel boundaries. These lines are provided only as a guide in understanding the pixel layout. The active portion 526 of the pixels occupies only about ¼ of the total pixel area. This defines a pixel aperture of approximately 25%. In this exemplary embodiment of the invention, the active region is not centered in the pixel area but is offset to the left and top as shown in FIG. 6A.

As shown in FIG. 6A, this spacing of the pixels leaves room along the edges of the display for the vias 520 and 522 to connect to the row and column electrodes of the pixel without interfering with the regular spacing of the pixels across tile boundaries. In the exemplary embodiment shown in FIG. 6A, the distance de, which is the distance from the active region 526 to the edge of the tile, is approximately twice the distance d, which is the internal distance from the edge of the active area of the pixel 526 to the pixel boundary 522 or 524.

Although the pixel diagram shown in FIG. 6A has the active region of the pixel being offset both horizontally and vertically, it is contemplated that the active area may be offset only vertically. In this configuration, the contacts to the row electrodes are beneath the active pixel material and, thus, do not need to offset the active region of the pixel.

Figure 7:
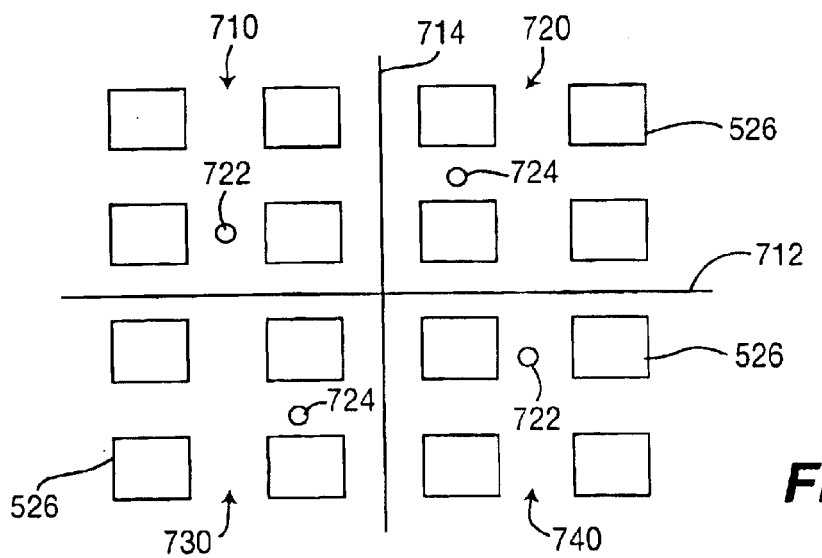
FIG. 7 is a pixel diagram which shows an exemplary pixel layout for portions of four tiles having the structure shown in FIG. 3.

FIG. 7 is an alternative pixel layout, suitable for use for a tile such as that shown in FIG. 3. In the layout shown in FIG. 7, the active portions 526 of the pixels are centered in their respective pixel regions and the vias which connect the row and column electrodes of the display to the electronics are formed between respective pixel elements. The distance between the edge of an active region 526 and the edge 712 of the display is equal on all sides of the tile and the distance from the center of the active pixel region to the edge is ½ of the pixel pitch. As described below with reference to FIG. 19, however, the distance between the center of an edge pixel and the edge of the tile may be slightly less than ½ of the pixel pitch in order to allow a mullion to be inserted between adjacent tiles. As described below, mullions are typically used both to join tiles on the display device and to hide the edges where the tiles meet.

Figure 8A:
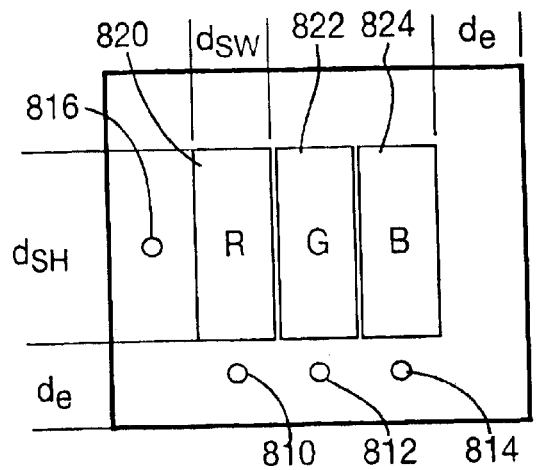
FIG. 8A is a front-plan view of a single color pixel structure which includes separate sub-pixels.
Figure 8B:
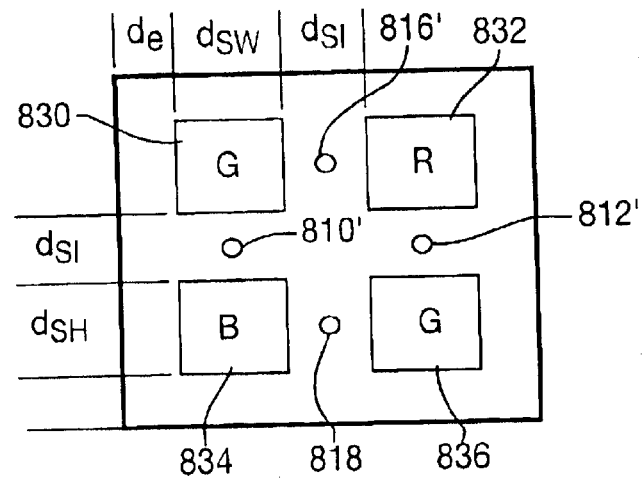
FIG. 8B is a front-plan view of an alternative single color pixel structure which includes separate sub-pixels.

The displays described above have been, in general, monochrome displays. The pixels have a single emissive area which is controlled by a single row and column electrode pair. Color pixels may be implemented as shown in FIGS. 8A and 8B. FIG. 8A shows a single pixel having separate red (R) 820, green (G) 822 and blue (B) 824 sub-pixels. The three sub-pixels 820, 822 and 824 each have a respective column electrode (not shown) which is connected to the electronics section by the vias 810, 812 and 814, respectively. A single row electrode (not shown) is used by all three of the sub pixels. This row electrode is coupled to the electronics section by the via 816, shown in phantom. The geometry of the triple sub-pixel structure is defined by $d_{SH}$, the height of the sub-pixel, $d_{SW}$, the width of the sub-pixel, and $d_e$, the distance from the active sub-pixel areas to the edge of the pixel area. For one exemplary embodiment of the invention, these dimensions are given in Table 1 in terms of the pixel pitch, P.

TABLE 1

| | |
|---|---|
| $d_{SH}$ | .5P |
| $d_{SW}$ | .16P |
| $d_e$ | .25P |

FIG. 8B illustrates an alternative color pixel structure. This structure includes four sub-pixel elements, 830, 832, 834 and 836. Two of these sub-pixel elements, 830 and 836 emit green light when stimulated while the other two pixel elements, 832 and 834 emit red and blue light, respectively. This structure is known as a quad sub-pixel structure. The structure uses two green sub-pixels because more of the luminance information in a color display is in the green pixels than is in either of the red or blue pixels. Thus, the use of two green sub-pixels allows for a brighter display. Alternatively, the pixels 830 and 836 may both be red or blue pixels. In some display technologies, the amount of light emitted by the red or blue pixel material may be less than the amount of light emitted by the green pixels. In this instance, making the pixels 830 and 836 both be red or blue pixels would improve the overall brightness of the display. The pixel structure shown in FIG. 8B employs two row electrodes (not shown) and two column electrodes (not shown). The row electrodes are coupled to the electronics section by the vias 816' and 818 (shown in phantom) while the column electrodes are coupled to the electronics section by the vias 810' and 812'. The geometry of the quad sub-pixel structure is defined by the dimensions $d_{SH}$ the height of the sub-pixel, $d_{SW}$, the width of the sub-pixel, $d_e$, the distance from the active sub-pixel areas to the edge of the pixel area, and $d_{SI}$, the distance between adjacent sub-pixels. These values are defined in Table 2 for the exemplary embodiment of the invention.

TABLE 2

| | |
|---|---|
| $d_{SH}$ | .25P |
| $d_{SW}$ | .25P |
| $d_e$ | .125P |
| $d_{S1}$ | .25P |

While FIGS. 8A and 8B show the distances $d_c$ and $d_{SI}$ as being equal in the horizontal and vertical directions, it is contemplated that these values may be different. The exemplary pixel structures shown in FIGS. 8A and 8B both have active pixel areas covering approximately 25 percent of the pixel area to produce a pixel aperture of approximately 25 percent. This value is exemplary only. The invention contemplates both larger and smaller pixel apertures.

Figure 9:
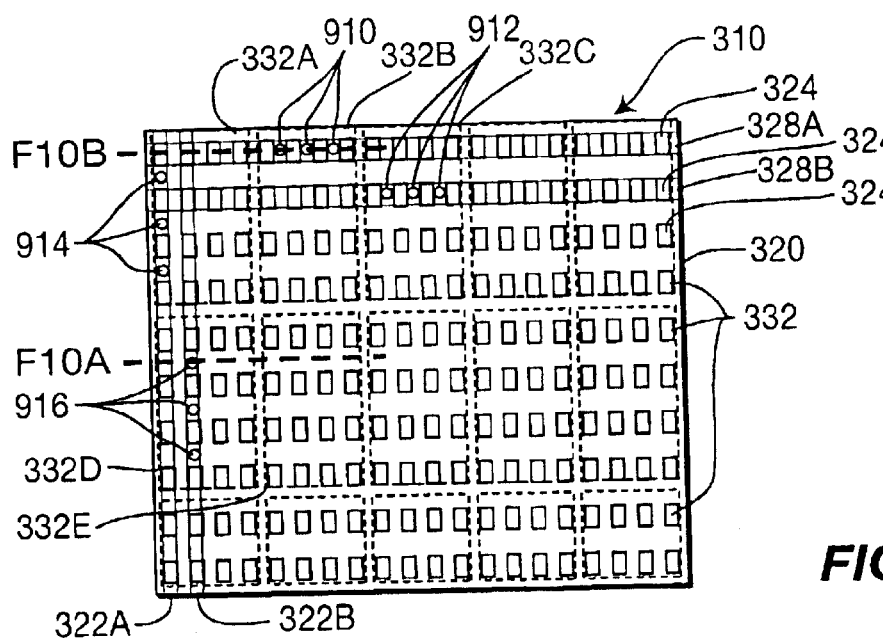
FIG. 9 is a front plan view of a tile having the structure shown in FIG. 3 which illustrates an exemplary method by which electrical connections may be made to the row and column electrodes of the tile.
Figure 10A:
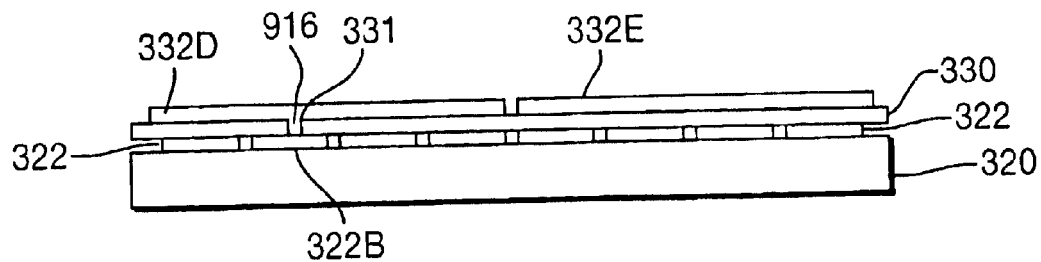
FIG. 10A is a cut-away view of the tile shown in FIG. 9 along the line F10A which illustrates an exemplary contact structure for a column electrode.
Figure 10B:
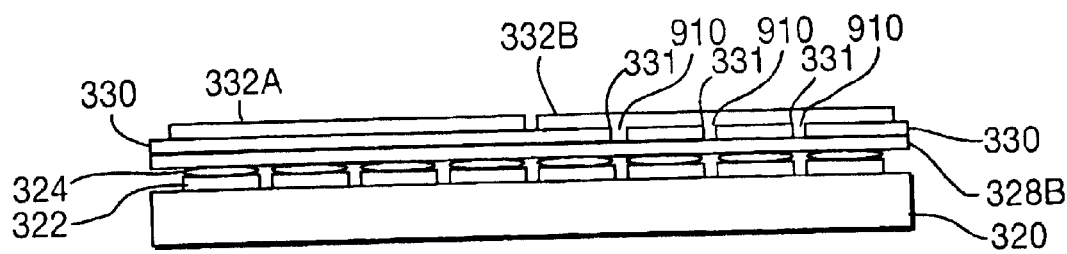
FIG. 10B is a cut-away view of the tile shown in FIG. 9 along the line F10B which illustrates an exemplary contact structure for a row electrode.

As described above with reference to FIGS. 3, 4, 8A and 8B, the electronics section of the assembled tile includes connecting plates 332 which form electrical connections to individual row or column electrodes across the area of the display tile. FIGS. 9, 10A and 10B illustrate an exemplary manner in which these connections may be made. FIG. 9 is a front plan view of an exemplary tile with the connecting plates 332 shown as dashed line boxes. The insulating layer 330 has been removed for clarity. FIG. 9 also includes two row electrodes 328A and 328B and two column electrodes 322A and 322B. Column electrode 322A is shown as being connected to connecting plate 332A through the vias 914. Column electrode 322B is shown as being connected to connecting plate 322D through the vias 916. Row electrodes 328A and 328B are coupled to the respective connecting plates 332B and 332C through the vias 910 and 912 respectively.

FIGS. 10A and 10B show cutaway views of a portion of the electronic section shown in FIG. 9 along the lines F10A and F10B respectively. FIGS. 10A and 10B include the insulating layer 330 which was omitted from FIG. 9. As shown in FIG. 9, the connections 916 to the column electrodes 322B are made on a region of the display tile which is between active pixel elements. Thus, FIG. 10A shows only the float glass substrate 320, the column electrodes 322, the insulating layer 330, and the connecting plates 332D and 332E. The via 916 between the connecting plate 332D and column electrode 322B is made through the opening 331 in the insulating layer 330. This connection may be made for example, when the connecting plate is printed on the electronics section by allowing the silver paste or ink used in the printing process to flow through the opening 331 and make contact with the column electrode 322B.

FIG. 10B illustrates an exemplary method for making connections to the row electrodes. As shown in FIG. 9, the connections to the row electrodes are made on a portion of the display containing the active pixel elements 324. The segment of the display shown in FIG. 10B includes the glass substrate 320, transparent column electrodes 322 display material 324 and row electrode 328B. As shown in FIG. 9, the connecting plate 332B makes connection with the row electrode 328B using the vias 910. This connection is made through the openings 331 in the insulator 330. As shown in FIG. 10B, there are several openings such that connection between the connecting plate 332B and row electrode 328B may be made at several locations. These multiple openings provide redundancy which increases yield in the completed display tiles. Although FIG. 10B shows the connection between the connecting plate 332B and row electrode 328B being made in the space between respective pixels 324, it is contemplated that these connections may be made anywhere along the row electrode 328B and need not be limited to spaces between active pixel elements.

Although not shown in FIG. 10A, the connections to the column electrodes are also made at a plurality of locations along the connecting plates. Referring to FIG. 9, for example, there are three vias 916 representing connections between the connecting plate and 332D and the column electrode 322B.

Because each connecting plate makes electrical contact with only one row electrode or column electrode, it is desirable for the number of connecting plates implemented in a display tile to be greater than or equal to the sum of the number of columns and the number of rows in the tile. In an exemplary tile according to the subject invention, there are 28 rows and 32 columns of pixel elements. Thus, there should be at least 60 connecting plates and connecting pads in the tile display section and the tile electronic section. There are a total of 896 pixel positions on the exemplary tile. To allow for good isolation among the respective connecting plates and connecting pads, each connecting plate may cover 12 pixel positions arranged in a 2 by 6 matrix. Because the locations at which connections may be made to the column electrodes are more limited than the locations at which connections may be made to the row electrodes, the exemplary connecting plate may cover 2 row pixel positions by 6 column pixel positions.

Because ITO is not as good a conductor as aluminum or silver, there may be resistive voltage drops along the column electrodes from the locations at which the electronics module 134 is connected to the column electrode. To reduce the magnitude of these resistive voltage drops, it may be desirable to connect the electronics module to each column electrode at several spaced points along the column electrode. Because these points are desirably not adjacent, it may be desirable to allocate two or even three connecting plates 332 for each column electrode 322. Thus, the number of connecting plates 332 and connecting pads 334 may be greater than the sum of the number of row electrodes and column electrodes.

Other tile configurations are contemplated by the subject invention. One desirable configuration is a tile which extends the full length (height) of the display and has a width of, for example, 32 columns. A tile having this shape would require only horizontal (vertical) alignment. In addition, the connecting plates and connecting pads may be made to cover many more columns than rows, providing many more locations at which to make connections to the column electrodes than if the connecting plates and connecting pads were approximately square. It is also contemplated that a display may be formed from different shaped tiles, for example long tiles that span the entire height of the display on the sides and smaller, square tiles near the center of the display. The different tiles may also employ different pixel pitches such that the tiles on the sides of the display may have a relatively large pixel pitch while the tiles near the center of the display have a relatively small pixel pitch.

Furthermore, although the exemplary embodiments of the invention show the electronics sections of the tiles being the same size as the display sections, it is contemplated that these may be different sizes. For example, a single electronics section (not shown) may be as large as two contiguous display sections (not shown). When assembled into a single tile, two display sections would be aligned with and bonded to the single electronics section. In one contemplated configuration, an electronics section is formed which spans the entire display device and individual display section tiles are mounted onto the electronics section. In this configuration, the electronics section may include multiple electronics modules 132.

It is also contemplated that the electronics sections may be smaller than the display sections. Thus, an entire display may consist of a single display section (not shown) that is bonded to multiple electronics sections (not shown). It may be desirable to manufacture the display sections and the electronics sections in different sizes to maximize yield of both components. The assembly of multiple display sections onto a single electronics section should align the pixels such that no seam is visible between contiguous display sections.

Figure 12:
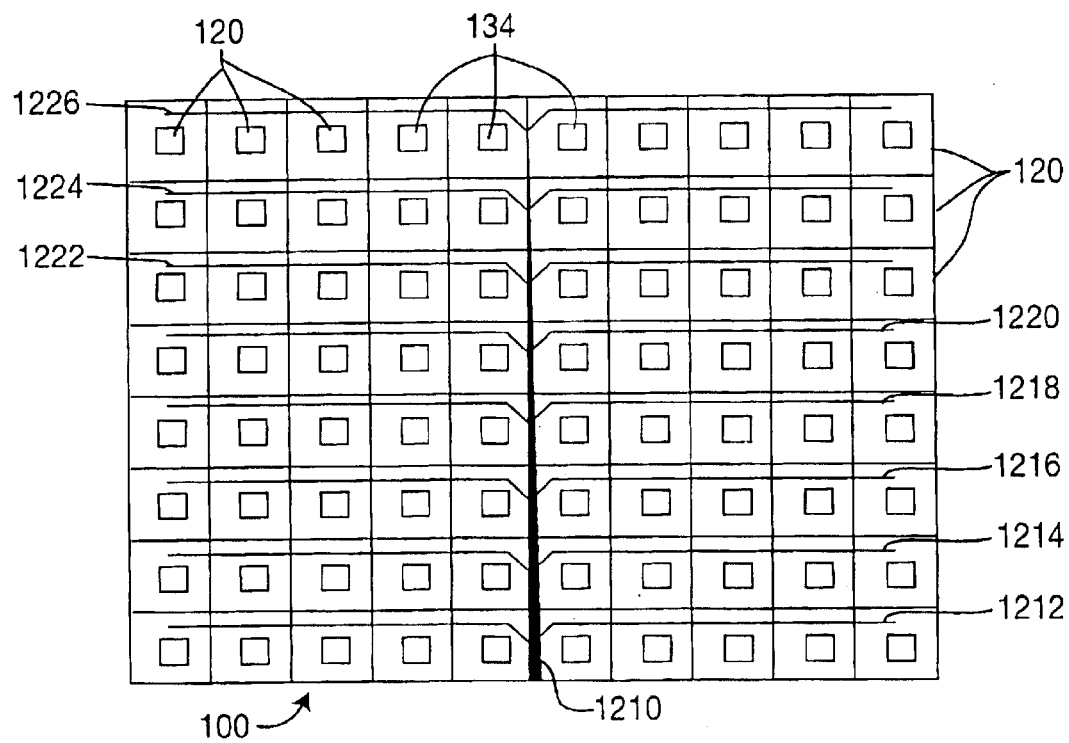
FIG. 12 is a back plan view of the tiled display shown in FIG. 1 which illustrates a power and signal distribution structure suitable for use with the tiled display.

FIG. 12 illustrates one way in which a plurality of tiles or a plurality of electronics modules on a single large tile may be connected to form a composite display device. FIG. 12 shows the display device 100 from the back. The exemplary display device includes a plurality of tiles 120 each of which includes an electronics module 134. The electronics modules are coupled to a central controller by a cable harness 1210 which includes a central cable and branching cables 1212, 1214, 1216, 1218, 1220, 1222, 1224, and 1226. In the exemplary embodiment of the invention, each tile is coupled to four conductive lines, two of which convey operational power, one which conveys the data signal and one which conveys timing information. The operational power lines for the display may be shared among several tiles. The signal lines in this exemplary embodiment of this invention, however, are not shared. It is contemplated that, by including addressing circuitry in the electronics module 134 on each tile, the signal and timing lines for the entire display device may also be shared. In this configuration, each module recognizes and stores only the portion of the data in the address range of the tile.

Figure 11A:
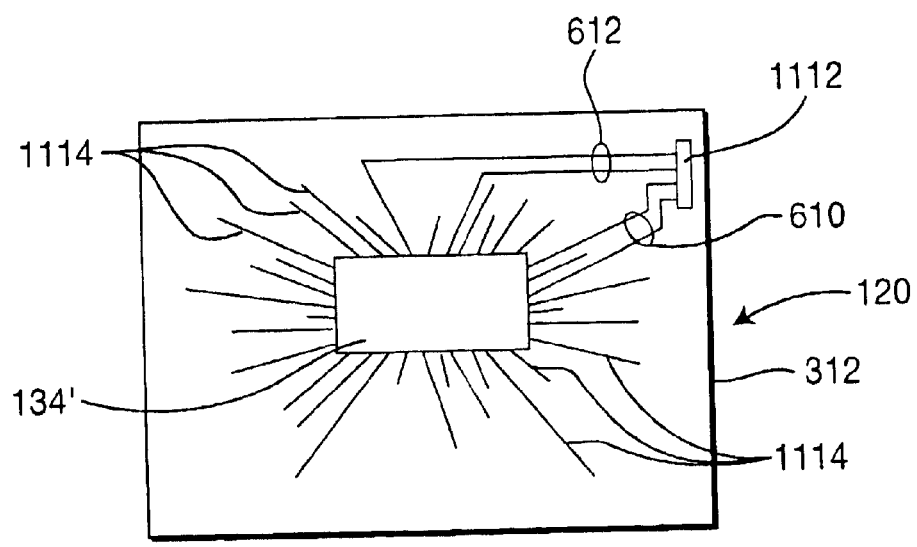
FIG. 11A is a back plan view which illustrates an electrical connection structure suitable for use with a tile having the structure shown in FIG. 3 and the distribution structure shown in FIG. 8.

FIG. 11A is a bottom plan view an exemplary type of tile 120, such as that shown in FIG. 3, which receives the data and timing signals electrically. The tile shown in FIG. 11A includes electronic circuitry 134' and a plurality of conductive traces 1114 all mounted on a circuit board 312. A shown in FIG. 11A, the operational power signal 612 are received via the connector 1112 as are the data and timing signals 610. The tiles shown in 11B may be configured in a display in the same manner as the tiles described below with reference to FIG. 12. As described above with reference to Using either method, the multiplexing of data to the tiles may be limited to a predetermined maximum. If the number of tiles exceeds this maximum value, only a portion of the display is updated at any given time. FIG. 6, the operational power signal may be shared among all of the tiles while the timing and data signals are distributed to each tile individually. Alternatively, the timing and data signals may be shared by all of the tiles if each tile includes addressing circuitry to selectively separate its data from the data broadcast to all of the tiles.

Figure 11B:
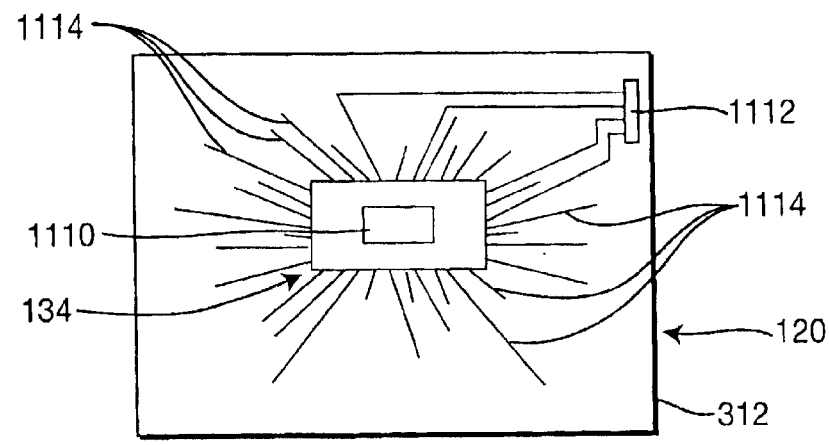
FIG. 11B is a back plan view which illustrates a combined optical and electrical connection structure suitable for use with a tile having the structure shown in FIG. 3.

FIG. 11B is a back plan view of a another type of tile 120 which receives its timing and data signals optically rather than electrically. The tile includes an electronics module 134 and a plurality of conductive traces 1114 formed on a circuit board 312. The electronics module 134 shown in FIG. 11B, however, is coupled to receive only operational power at the connector 1112 Data signals and timing information are conveyed to the module 134 via an optical coupling 1110 which is a part of the electronics module 134. The exemplary optical coupling 1110 may receive one or more optical fibers in a direct connection or may include a photosensitive area which receives a broadcast timing and data signal. When a broadcast signal is received, the electronics module 134 may include addressing circuitry to separate out the data which is addressed to the particular tile and store only that data for display. An optical interface suitable for use in the electronic circuit 134 in FIG. 11B is describe in U.S. Pat. No. 5,281,805 entitled, OPTICAL-INPUT LATCH-CIRCUIT CELL ARRAY to Sauer, which is incorporated herein by reference for its teachings on optical interfaces.

Figure 13:
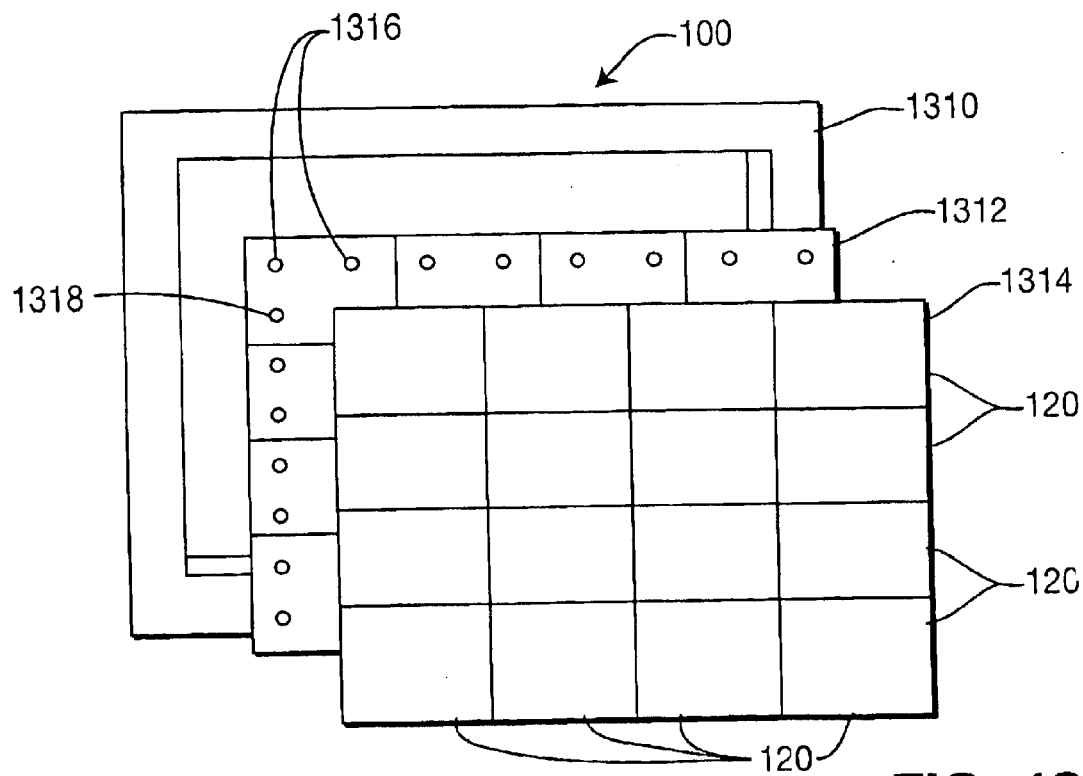
FIG. 13 is an exploded isometric drawing which illustrates a first mounting method suitable for use with the tiled display shown in FIG. 1.

FIG. 13 is an exploded front plan view of an exemplary tile assembly according to the present invention. The exemplary assembled display device 130 includes a frame 1310 in which is mounted a rigid back panel 1312. The back panel includes connectors 1316 to provide operational power to each of a plurality of display tiles 120 and a pair of connectors 1318 (only one of which is shown in FIG. 13) which provide the data and timing information to each tile 120 of the assembled display device. The connectors 1316 and 1318 may be solder-type connections or they may be plug-type connectors. Plug-type connectors may be preferred when easy access to the individual tiles is desired, for example, to enable defective tiles in the display to be replaced. The exemplary display shown in FIG. 13 may be assembled by mounting the individual tiles 120 on the back plane 1312 and then mounting the assembled back plane and tile display on to the frame 1310. The assembled display may then be covered with a float-glass plate (not shown), which acts to protect the tiles and, optionally, may act, with the back plane 1312 and the frame 1310 to form a hermetic seal for the assembled display device 100. Because the spacing between the tiles is desirably kept within close tolerances to maintain a substantially constant pixel spacing across the display, the tolerances for the connectors formed on the backs of the tiles 120 and on the back panel 1312 are desirably precise.

Figure 14:
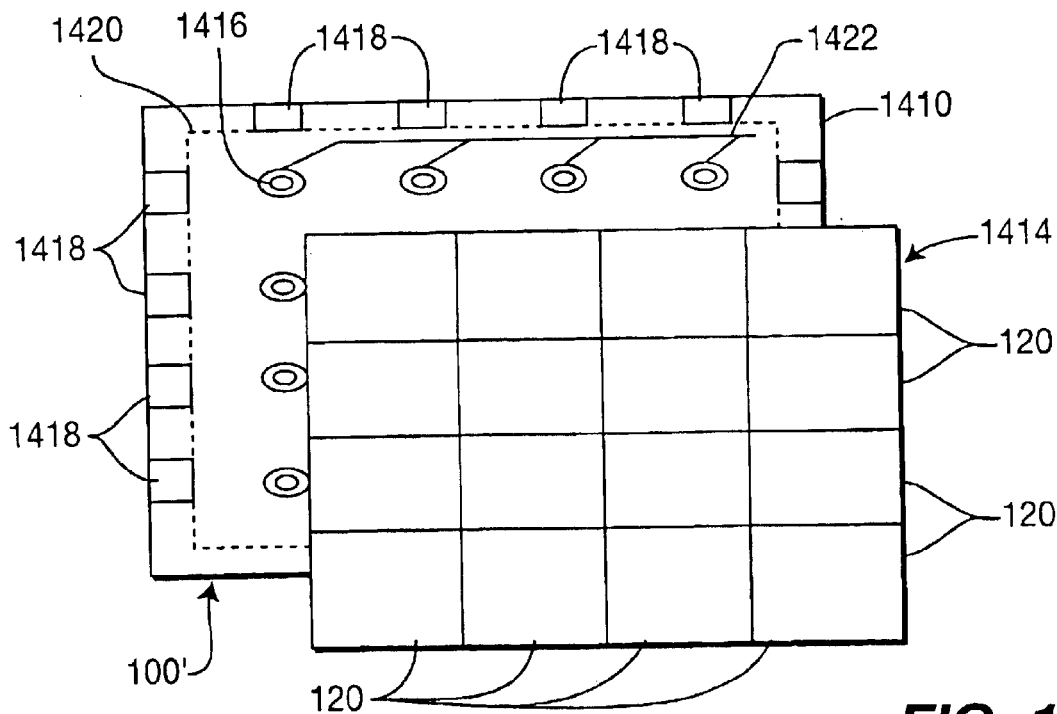
FIG. 14 is an exploded isometric drawing which illustrates a second mounting method suitable for use with the tiled display shown in FIG. 1.

As an alternative to the structure shown in FIG. 13, a self aligning structure such as that shown in FIG. 14 may be used. This structure does not require the precise manufacturing tolerances of the structure shown in FIG. 13. In FIG. 14, the frame 1410 includes a plurality of spring elements 1418. In addition, the power, timing, and data signals are brought to the individual tiles by respective flexible connectors 1416. The connectors 1416 may also act to push the tile forward to make contact with a float-glass front plate (not shown). The connectors 1416 are coupled to receive the power, data and timing signals via a wiring harness 1422. In the exemplary embodiment of the invention shown in FIG. 14, each of the tiles is mounted, within the frame 1410, on its respective flexible connector 1416. When a row or column of the tiles is fully assembled, the springs 1418 of the frame 1410 tend to confine the tiles to an area indicated by the dashed line box 1420. When all of the tiles are assembled into the frame 1410, the springs 1418 act to hold the tiles in alignment. To augment the self-aligning structure, the edges of each tile may be formed in complementary patterns (not shown) such that the patterns of adjacent tiles mate, holding the tiles in alignment. For example, opposite edges of a tile may be patterned with complementary serrated edges which allow each tile to mate with an adjacent tile in only one position. It is contemplated that these edge patterns may be made on the display section or on the electronics section. Making the edge patterns only on the electronics section is desirable as it simplifies the edge fabrication for the display sections. The design shown in FIG. 14 may be advantageous as it does not require precision assembly of the components as may be required by the design shown in FIG. 13.

FIGS. 15 through 20 illustrate another exemplary method by which tiles 120 may be joined to form a composite tiled display 100. By definition, there is a physical gap between the tiles in a tiled display. It is desirable to make this physical gap invisible to the viewer. Invisible in this context means that light emitted by the pixels that may be scattered or refracted at the gap should not be seen by a viewer, and that no external line-of-sight exists which would enable a viewer to detect the physical gap.

State-of-the-art tiled displays using CRTs or projection displays use a mullion between the individual displays to hide the physical gap, however, these mullions are visible to the observer and are also objectionable to the viewer because they break the continuity of the image. It is, therefore, desirable that any structure used to make the gap invisible does not break the continuity of the larger image.

Another structure commonly found in both tiled and non-tiled displays is a black matrix. A black matrix may be fabricated from black lines. The black matrix is put between the active portions of the pixels to absorb ambient light in these areas in order to increase the display contrast. Black matrix lines may be found, for example between the phosphors on the front screen of a CRT or between the pixel positions defined for a liquid crystal display. In tiled displays, black matrix lines are typically smaller than mullions and are typically placed in the plane of the pixels. Because the black matrix lines are periodic and placed between the pixels, they do not tend to break the continuity of the image.

Figure 19:
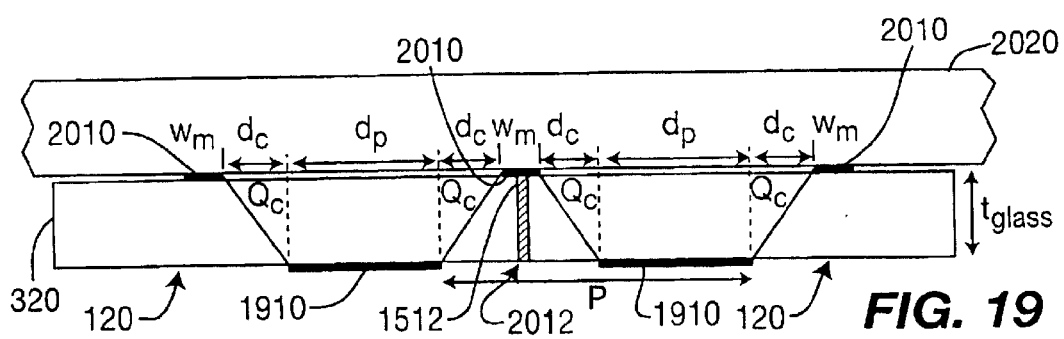
FIG. 19 is a cut-away side plan view of the glass plate of two adjacent pixels of a tile having the structure shown in FIG. 3 or FIG. 4 which is useful for describing a method for forming a black matrix for the tile.

The present invention employs an optical structure that may be incorporated in a tiled display to make the physical gaps between the tiles indistinguishable from the black matrix and, thus, invisible to the viewer. An illustration of this structure is shown in FIG. 19. FIG. 19 is a cut-away drawing of a partially assembled display device. The main components of the structure shown in FIG. 19 are a transparent sheet 2020 of, for example, glass or plastic, a plurality of black lines 2010 that form a black matrix and the tiles 120 which form the display. The key feature of the optical integrator structure is a pattern of black lines 2010 which are like black matrix lines in that they have equal widths and a spacing equal to the pixel pitch. These black lines 2010 may be aligned to lie between all pixels in the display, including those pixels on either side of the gaps 2012 between the tiles 120. The optical integrator pattern of black lines are also like mullions in that some of the black lines in the optical integrator structure lie on top of the gaps between the display tiles and block their visibility. As assembled, the glass substrates 320 of the tiles 120 are positioned adjacent to the black lines 2010 on the back surface of the transparent sheet 2020, which forms the integrating structure.

Unlike a conventional black matrix, the disclosed optical structure for integrating display tiles is placed above the plane containing the pixels (like mullion structures), on the viewer-side of the tiles 120, with the black line pattern being in contact with the display tiles. Unlike mullions, the black lines on the optical integrator structure 2020 are relatively narrow, so that the black lines which cover the mullions are essentially the same width as the black lines which form the black matrix. Thus the disclosed structure simultaneously provides the functions of the black matrix and the mullions, but the mullion lines are not visible, as such, to the viewer because all lines in the pattern on the optical integrator structure 2020 are essentially the same and are virtually indistinguishable. Accordingly, the viewer simply sees a uniform pattern of black lines. A key feature of this aspect of the subject invention is the precise specification of the pattern of black lines and mullions on the disclosed optical integrator structure so that the physical gaps between tiles are hidden from the viewer, and at the same time so that little or no emitted light is blocked from exiting the display. In addition, the black matrix and the mullions do not disturb the continuity of the larger image, even across the gaps between tiles.

Figure 15:
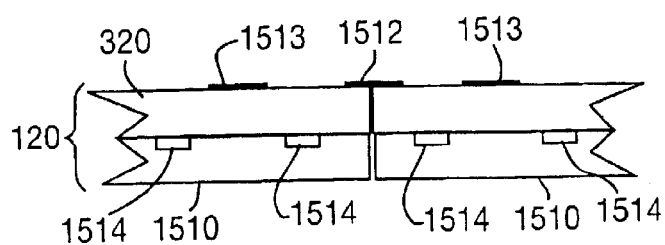
FIG. 15 is a cut-away side plan view of a portion of the tiled display shown in FIG. 1 which illustrates an exemplary method for joining adjacent tiles.
Figure 20:
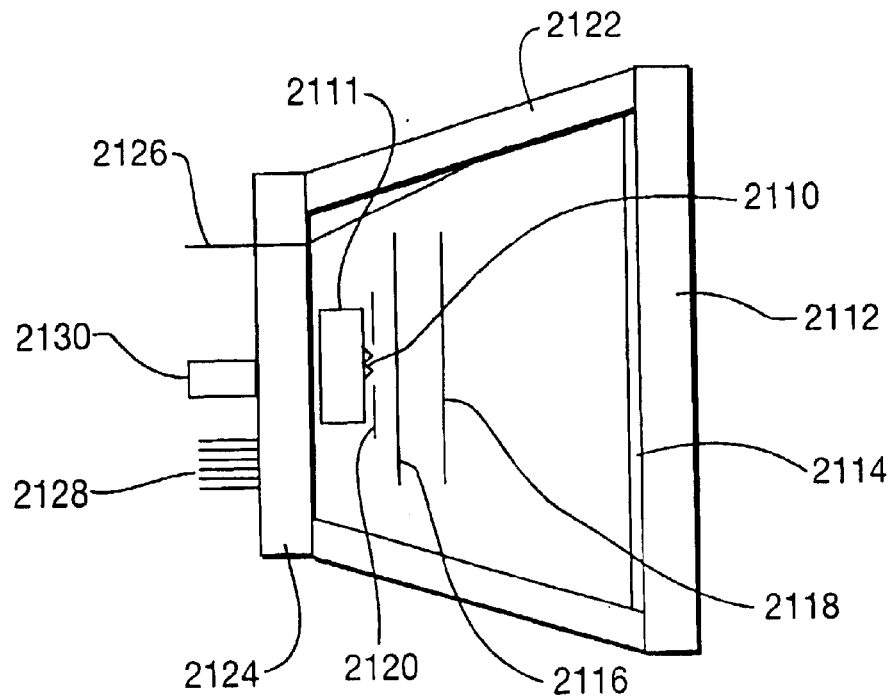
FIG. 20 is a cut-away side plan view of a cathodoluminescent tile suitable for use in a tiled display according to the subject invention.

To more easily explain the optical integrator structure shown in FIG. 20, a method of joining tiles using discrete mullions is first described. FIG. 15 is a cross section of portions of two tiles 120, according to the present invention, which are joined by a mullion. Each of the tiles includes a glass substrate 320 and the remainder of the tile structure 1510. The exemplary tiles include active display material 1514 located proximate to the bottom surface of the glass substrate 320. The exemplary tiles also include a mullion 1512 and black lines 1513 which form a portion of the black matrix.

Figure 16:
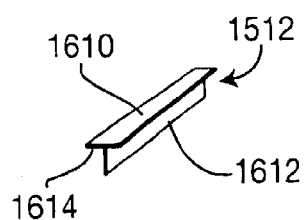
FIG. 16 is a perspective view of a mullion suitable for use with the joining method shown in FIG. 15.

FIG. 16 is a perspective drawing of an exemplary mullion 1512 suitable for use with a display device according to the subject invention. The mullion 1512 includes a top surface 1610 which may be formed from a black material or may be printed or painted black. To ensure that the mullion does not create artifacts on the display device, it is desirable for the top surface of the mullion to closely match the black stripes in size, color and gloss. The mullion 1512 also includes a bottom stem having side surfaces 1612 which are desirably formed from a light-colored material (e.g. white). Alternatively, the bottom stem of the mullion may be transparent and have an index of refraction close to that of the float glass substrate 320. It is desirable for the bottom stem of the mullion to be light-colored or transparent so that any light scattered in the vicinity of the mullion has the same properties as light that is scattered among pixels at the interior of a tile. If light scatters differently at the edge of a tile than near the center then the edge may be visible, for example, as a band of reduced brightness in the displayed image. One or more of the side surfaces 1612 and the underside 1614 of the top bar of the mullion may be coated with adhesive to attach the mullion 1512 to the two tiles which it joins. If all of these surfaces are coated with adhesive, the mullions may be used to join the tiles into a display device.

Figure 17:
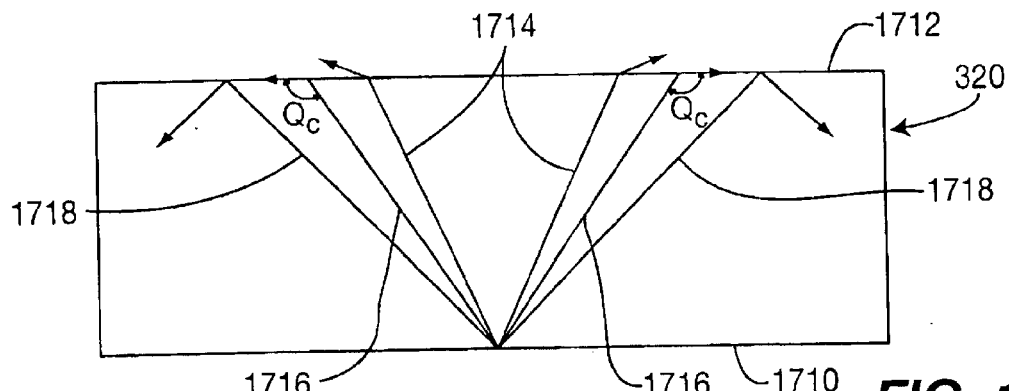
FIG. 17 is a cut-away side plan view of the glass plate of a pixel of a tile having the structure shown in FIG. 3 or FIG. 4 which is useful for describing a method for forming a black matrix for the tile.

To determine the optimum placement for a black stripe or a mullion on the front surface of the glass substrate of an emissive display, it is helpful to understand the properties of light emitted by the display. FIG. 17 shows a cross section of an exemplary glass substrate 320 which includes a bottom surface 1710 and a top surface 1712. A number of representative optical rays, 1714, 1716 and 1718 are shown emanating from a point on the bottom surface 1710. Some rays 1714 exit the glass and some rays 1718 are totally internally reflected from the top surface and are trapped in the sheet of glass. At the transition between these two types of rays are rays 1716 which are refracted to an angle parallel to the top surface 1712 of the substrate 320.

The angle of incidence of the rays 1716 which are at the transition is called the critical angle ($\Theta c$). Light reaching the surface 1712 with angles less than the critical angle exits the glass, and light reaching the surface 1712 with angles larger that the critical angle are totally internally reflected. The critical angle is dependent on the index of refraction, $n_{glass}$, of the glass substrate 320 as shown in equation (1):

$$\Theta_c = \operatorname{Sin}^{-1}(1/n_{glass}) \quad (1)$$

In the exemplary embodiment of the invention, $n_{glass}=1.55$ and $\Theta_c \approx 40°$.

Figure 18:
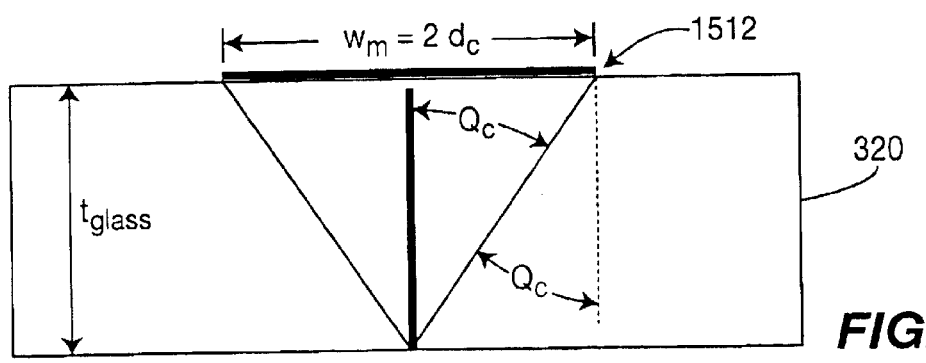
FIG. 18 is a cut-away side plan view of a portion of the glass plates of two adjacent tiles which shows how the tiles may be joined by a mullion such as that shown in FIG. 16.

A tiled display is made of tiles that are placed in an array so that the spacing between pixels across the gap between tiles is substantially the same as the pitch between pixels within the display tiles. Thus, the display tile edge is one half pitch distance (or slightly less) from the center of the last pixel. Because of the critical angle, light emitted from a point within a sheet of glass can travel at most a lateral distance of $d_c = t_{glass} \operatorname{Tan}(\Theta_c)$, where $t_{glass}$ is the thickness of glass. Therefore, light from any part of a gap region may be blocked by putting a black stripe of width $W_m \geq 2d_c$ over the gap region. Such a black stripe is shown in FIG. 18 as the top of the mullion 1512. Because of the symmetry of optics, the same black stripe blocks any external rays from making the gap region visible. Thus this black stripe makes the gap region invisible to an observer. In practice, the black stripe may need to be slightly wider than $2d_c$ to account for any finite width of the gap.

Referring, again, to the structure shown in FIGS. 20 and 20A, the individual tiles do not need to be joined by discrete mullions. Instead, the tiles may be assembled directly on the back surface of the optical integrating structure 2020 such that the gaps are positioned directly over black stripes having a width $W_m$. As shown in FIGS. 20 and 20A, the exemplary optical integrating structure 2020 is positioned on top of the array of tiles, with the black lines on the surface of the structure in contact with the glass substrates 320 of tiles. The centers of the black lines are aligned with the gaps between the tiles so that the gap regions can not be seen by an observer. Although this embodiment of the invention does not need discrete mullions, if the tiles are connected by mullions 1512, the integrating structure 2020 may include black lines that cover the top surfaces 1610 of the mullions. In this instance it would be desirable for the top bar of the mullion to be as narrow as possible to minimize any gap between the top surface of the tile 120 and the back surface of the integrating structure 2020. Alternatively, the mullions 1512 may be assembled onto the integrating structure 2020 with the black matrix lines. In this configuration, the mullions form pockets into which tiles 120 are inserted to form the composite display. This structure may be formed by attaching the mullions directly to the integrating structure 2020 using an adhesive and then applying an adhesive to the undersides of the crossbars 1610 and to the sides of the stems before inserting a tile into the display.

The black lines on the optical integrating structure 2020 that form the mullions which are used to cover the inter-tile gap tend to be wider than the typical black matrix line and may block some or all of the light emitted from the pixels near the edge of the tile. To allow the maximum amount of light to pass and yet avoid any artifact distortion in the assembled display device, the display tiles and the black stripes on the integrating structure 2020 are desirably specifically designed to have particular relationships.

FIG. 19 shows a cross section of a pixel which includes two pixel regions. The emissive regions 1910 at the bottom of the glass substrate 320 have a width $d_p$. The light rays that can exit the glass section and are useful for viewing, exit the top of the glass 320 in an area having a width $w=2d_c+d_p$. A display tile has an array of pixels equally spaced a distance known as P, the pixel pitch. Therefore, to not block any viewable light, it is desirable for the black matrix to have a width, $W_m \leq P-d_p-2d_c$. The dimensions illustrated in FIG. 19 depict the case where the black matrix stripe completely hides the gap and yet, blocks no emitted light.

There are two width criteria to be met by the black stripes that form the black matrix, and the top bar of the mullions: $W_m \geq 2d_c$ (to hide the gap), and $W_m \leq P-d_p-2d_c$ (to avoid blocking light from the pixels). The most desirable solution is the design point with the largest glass thickness, where both criteria are met. That design point is met when the thickness of the glass is 0.15 times P, the pixel pitch, and the width of the black stripe is 0.25 times the pixel pitch. Designing the display tile and black matrix stripes to meet that condition results in making a large area display by integrating individual tiles behind the optical integrating structure has the result that the individual tiles having inter-tile gaps that cannot be detected.

When the thickness of the glass substrate 320 and the width of the black stripe satisfy the criteria described above, no light that is directed toward a viewer directly in front of the display (e.g. viewing from a normal angle) is blocked, but some light from greater viewing angles may be blocked. Meeting these criteria, however, leads to improved contrast since the fraction of the display occupied by the black matrix is larger. In other words, some blockage of light from wider viewing angles may be considered acceptable as being advantageous for higher contrast at normal viewing angles.

As described above, in the exemplary embodiment of the invention, the pixels on the tiles have an aperture of approximately 25% in order to allow room within the pixel for a via to make electrical contact with a column electrode. Thus, in the exemplary embodiment of the invention, $d_p$ is approximately P/2. This relatively small aperture also has advantages by making it easier to hide the inter-tile gap and allowing a relatively large-stripe black matrix to improve the contrast of the display.

It is contemplated that the contrast may be further improved by coating the viewer-side of the integrating structure 2020 with an antireflection coating and/or by adding an ambient light absorber or color filter on that surface or in the bulk of the material (e.g. glass or plastic) from which the optical integrating structure 2020 is constructed.

It is also contemplated that the integrating structure 2020 may include a diffuser coating on the viewer-side surface. This diffuser enlarges the apparent size of the pixels reducing the visibility of the individual pixels and black matrix structure. Thus, a diffuser may act to reduce the graininess of the displayed image. This may be significant, especially for display devices having relatively large pixels or which have smaller pixels but are designed to be viewed at close proximity to the display device. Another method by which the visibility of the pixel structure may be reduced is to use a quad pixel structure, such as that shown in FIG. 8B, in which spaced single-color sub-pixels form a single color pixel.

The integrating structure 2020 also provides a simple way to align and mount the display tiles. In particular the patterns on the integrating structure 2020 may be accurately aligned with the pixels using, for example moiré patterns, to position a tile and then the tile may be mounted onto the structure 2020 with an optically clear adhesive.

Although the embodiments of the invention described above have been in terms of an OLED display device, it is contemplated that similar concepts may be practiced with other types of display tiles. The example described below, with reference to FIGS. 21 through 24 concerns a cathodoluminescent display. Cathodoluminescent displays may be relatively low power devices, such as field-emissive displays (FEDs) or higher power devices such as Jumbotrons which use thermionic cathodes.

Current concepts for cathodoluminescent modules that would be tiled together to form a billboard display call for a cathode for each color subpixel. For example, a 4 pixel×4 pixel color module would therefore require an array of cathodes consisting of 4 rows and 12 columns. In turn, this would require 4 leads for 4 rows and 12 leads for 4 triplets of R, G, B columns, for a subtotal of 16 leads. Two additional leads would be required: one of anode potential and one to provide voltage on the control grid. Thus, the total number of leads is 18.

A cathodoluminescent tile according to the present invention would provide for a greatly reduced number of leads and cathodes and would have other performance benefits as well. In the concept disclosed herein, each cathodoluminescent tile includes a plurality of color pixels arranged on a screen, a single cathode and X and Y electrostatic focus/deflection grids that are used to raster a beam across the screen of color pixels. The 4×4 module would have two leads for the X focus/deflection plates, two leads for the Y focus/deflection plates, one lead each for the cathode and control grid, and one lead for the anode. Thus, a 4 by 4 pixel tile according to the present invention would use only seven leads as opposed to 18 leads for the conventional configuration.

Electrostatic deflection may provide a total deflection angle of $\leq 60°$. Larger angles may require higher power and incur more beam distortion, but would also provide for a thinner module, if desired. For example, a 3" diagonal module according to the present invention would be 2.5 to 3" deep.

The module may be implemented with either a thermionic source of electrons or array of field emitters. The source could be either elongated or square. A square source is appropriate for use with a screen where each square pixel is divided into 4 square color subpixels consisting of R, G, B, and G regions (i.e. a quad sub-pixel structure). An elongated source would be appropriate for square pixels segmented into elongated regions of R, G, and B phosphor (i.e. a triple sub-pixel structure).

Because the number of cathodes are reduced in the example from 3×4×4 to 1, a cathodoluminescent display according to the present invention represents a significant savings in manufacturing cost. In addition, the use of a single cathode in each module eliminates possible differences in the efficiency of the 48 cathodes.

Figure 21:
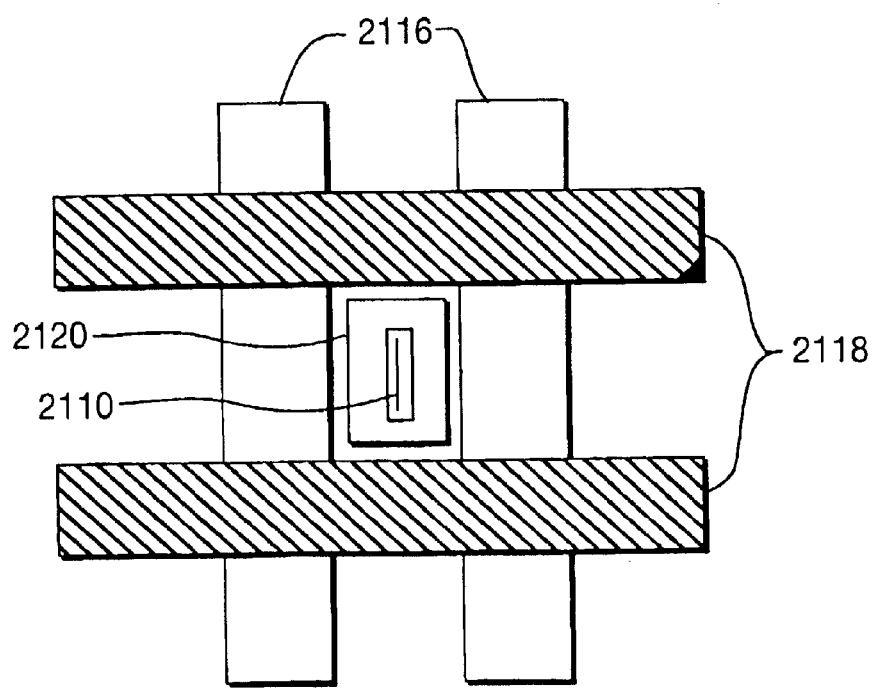
FIG. 21 is a schematic view of a first exemplary cathodoluminescent structure suitable for use with the tile shown in FIG. 20.

FIG. 21 is a cross-section of a tile according to the present invention. The exemplary tile includes a cathode 2110 on a support structure 2111. Emissions from the cathode 2110 are controlled by a control grid 2120 and are deflected by an x focus/deflection grid 2116 and a y focus/deflection grid 2118. The cathode 2110 and the grids 2120, 2116 and 2118 provide a stream of electrons to an aluminized phosphor screen 2114 which is mounted on the faceplate 2110 of the module. The face plate is a part of the physical structure that includes glass side walls 2122, which have a conductive coating (not shown) that is electrically connected to the aluminized phosphor screen 2114, and a back plate 2124. The physical structure is hermetically sealed and has an exhaust port 2130 through which air may be withdrawn to establish a vacuum in the physical structure. The module also includes a plurality of leads 2128 including electrical connections to the cathode, control grid and x and y focus/deflection grids. In addition, the module includes an anode supply 2126 which is connected to the conductive coating on the inside of the side walls 2122.

Figure 22:
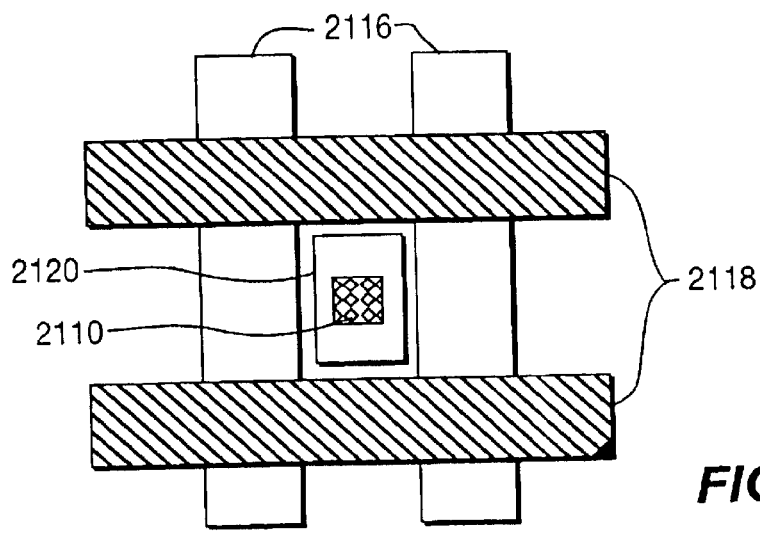
FIG. 22 is a schematic view of a second exemplary cathodoluminescent structure suitable for use with the tile shown in FIG. 20.
Figure 23:
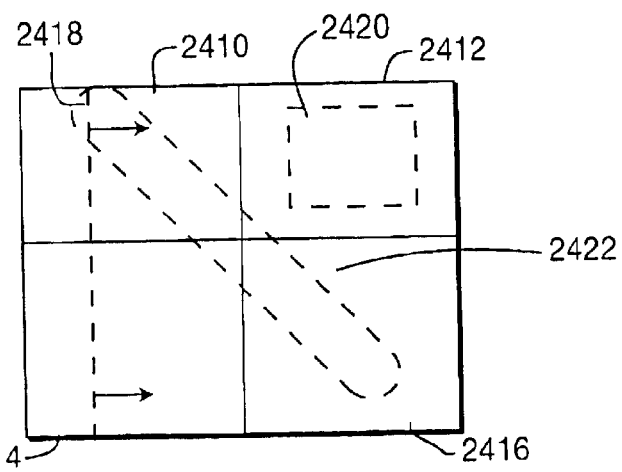
FIG. 23 is a front-plan view of the cathodoluminescent tile shown in FIG. 20.

FIG. 22 is a front plan view of an exemplary tile with the faceplate and phosphor screen removed. FIG. 22 shows one exemplary configuration of a thermionic cathode 2110, control grid 2120, x focus/deflection grids 2116 and y focus/deflection grids 2118. FIG. 23 shows a similar configuration except that the thermionic cathode of FIG. 22 has been replaced by a pattern of field-emissive cathodes. The structure shown in FIG. 22 produces a line of electrons which are selectively scanned across the phosphors to emit light while the structure shown in FIG. 23 may produce a shaped electron beam that may be more appropriate for activating a shaped phosphor or for concurrently activating multiple phosphors.

Figure 24:
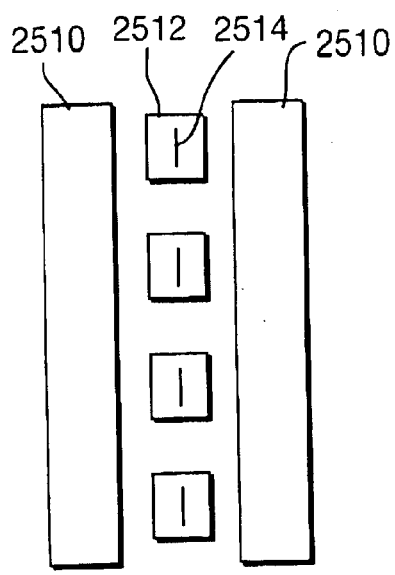
FIG. 24 is a schematic view of a third exemplary cathodoluminescent structure.

FIG. 24 is a front plan view of an exemplary cathodoluminescent tile according to the present invention which illustrates a number of different illumination techniques that can be achieved. The exemplary tile is a single color pixel having a quad sub-pixel structure which includes two green phosphor areas 2410 and 2416, a single red phosphor area 2412 and a single blue phosphor area 2414. The broken line 2418 represents a scan line that may be produced by a cathode such as that shown in FIG. 22. This line is generated by a fan-shaped beam of electrodes that is scanned across the pixels. To emit a white pixel, the beam is repeatedly scanned across all of the phosphor areas 2410 through 2416. To emit a green pixel, the y deflection electrodes may be controlled to deflect the beam only onto the phosphor areas 2410 and 2416. To emit a red or blue pixel, the beam may be deflected to scan across only the phosphor areas 2412 or 2414, respectively. To generate a yellow pixel, the beam may scan only the phosphor areas 2412 and 2416 while to generate a cyan pixel the beam may scan only the pixels 2410 and 2414.

The square area 2420 illustrates an electron beam that may be provided by an array of field emissive devices. This beam is shaped to the phosphor area and, accordingly, is appropriate for illuminating individual phosphor areas. The beam may be scanned in the same way as the fan beam 2418. In addition, the beam may be deflected in the y direction to illuminate a single phosphor area on the bottom row or on the top row. Finally, the beam may be defocused in either or both of the x and y axes to spread the beam across more than one phosphor area.

One case of deflection and defocusing of a shaped beam is shown as item 2418 in FIG. 24. In this instance, a square beam, such as the beam 2420 is deflected in both the x and y directions to produce a slanted beam and is defocused to illuminate the pixel areas 2410 and 2416 to the relative exclusion of pixel areas 2412 and 2414.

FIGS. 25 through 31 illustrate alternative cathodoluminescent display configurations which may provide greater brightness than the displays shown in FIGS. 21 through 24. The greater brightness is achieved using the same number of external contact or one additional contact.

Figure 25:
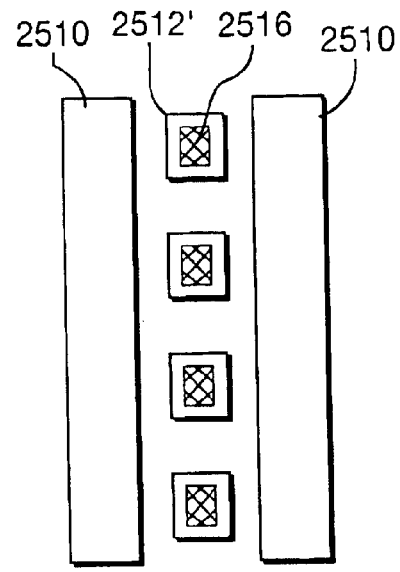
FIG. 25 is a schematic view of a fourth exemplary cathodoluminescent structure.
Figure 26:
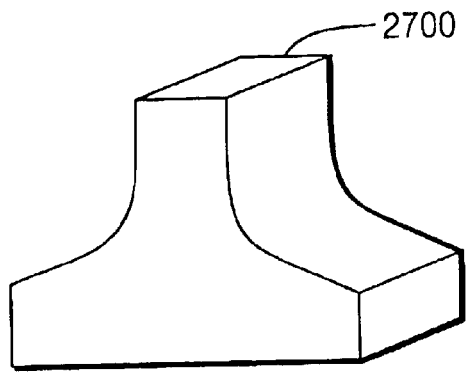
FIG. 26 is an isometric view of a cathodoluminescent tile suitable for use with the structures shown in FIGS. 24 and 25.

FIG. 25 is a front plan view of an exemplary tile with the faceplate and phosphor screen removed. The tile shown in FIG. 25 includes four cathodes, one for each row of sub-pixels in the display. An exemplary phosphor configuration for the tile is described below with reference to FIG. 31. As shown in FIG. 25, the exemplary cathodoluminescent tile includes four thermionic cathodes 2514 each with a control grid 2514 and a pair of x focus/deflection grids 2510. The display shown in FIG. 25 does not include any y-focus/deflection grids. Referring to FIG. 31, the dashed lines 3110 represent the electron beams generated by the cathodes 2514. These beams are scanned across the four rows of sub-pixels by the x deflection grids 2510 as shown by the arrows 3110. Each of the control grids 2512 has a separate external connection, while all of the cathodes 2514 are coupled together. The individual control grids 2512 may be modulated to selectively turn the electron beams generated by the cathodes 2514 on or off to selectively illuminate the sub-pixels 3114. FIG. 26 shows a similar configuration except that the thermionic cathodes of FIG. 25 have been replaced by patterned field-emissive cathodes 2516. The structure shown in FIG. 26 produces a shaped electron beam that may be more appropriate for activating a shaped phosphor. An exemplary scan produced by the cathode array shown of FIG. 26 is shown as items 3112 in FIG. 31.

In The display shown in FIGS. 25 and 26, the deflection of the electron beam in the x-direction is achieved electrostatically. It is contemplated, however that an electromagnetic deflection circuit may be used instead of the electrostatic deflection unit. The pixel structure of the cathodoluminescent display would be largely the same except that the x-grids 2510 only act as focus grids and, so, may be tied together and supplied from a single external signal connector.

Figure 30:
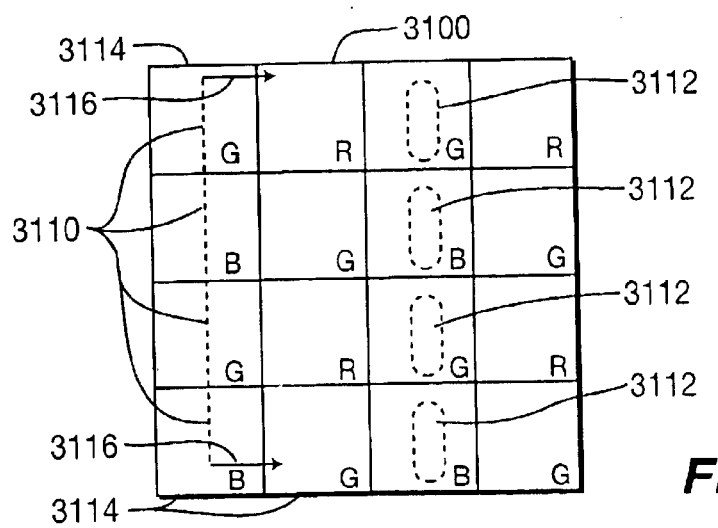
FIG. 30 is a front plan view of the cathodoluminescent tiles shown in FIGS. 24 through 29.
Figure 27:
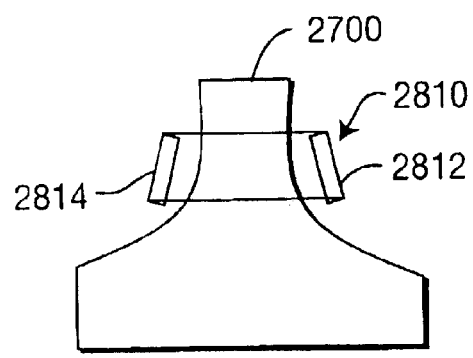
FIG. 27 is a top-plan view of a cathodoluminescent tile such as that shown in FIG. 26 showing an optional electromagnetic deflection unit.
Figure 28:
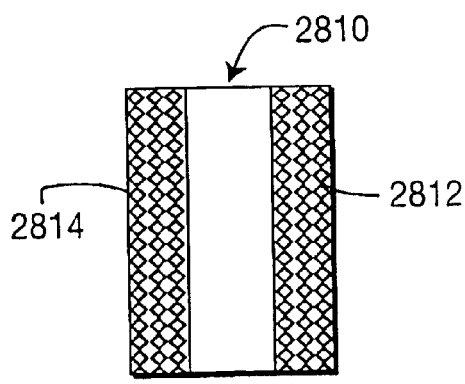
FIG. 28 is a cut-away view of a first deflection yoke suitable for use with the cathodoluminescent tile shown in FIG. 27.
Figure 29:
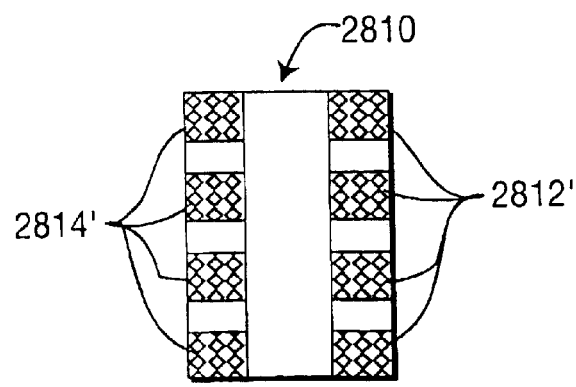
FIG. 29 is a cut-away view of a second deflection yoke suitable for use with the cathodoluminescent tile shown in FIG. 27.

FIGS. 27 through 30 illustrate possible configurations for a cathodoluminescent device which employs an electromagnetic deflection unit in the x-direction only. FIG. 27 is an isometric view of the device 27 which is shaped much like a conventional picture tube when viewed from the bottom or top but which appears square or rectangular when viewed from either side. As shown in the top-plan view of FIG. 28, an x-dimension deflection yoke 2810 is fit onto the neck of the tile. The yoke 2810 includes two deflection coils 2812 and 2814. FIGS. 29 and 30 illustrate possible configurations for the deflection coils 2812 and 2814. As shown in FIG. 29, the coils may be configured to generate a single uniform magnetic field to deflect all of the electron beams at the same time. Alternatively, as shown in FIG. 30, the coils 2812' and 2814' may be configured as separate coils and separately controlled to scan the individual electron beams provided by the cathodes 2514 or 2516. When electrostatic deflection is used, the exemplary tile uses one more external connection than the tile shown in FIGS. 22 through 24 because, although three control grid connections are added, the two connections to the vertical focus and deflection grids are deleted. When the electrostatic grids 2510 are used only to focus the beams in the tiles shown in FIGS. 27 through 30, one less connection to the tile is needed. Accordingly, the tile 2700 has the same number of external connections as the tiles shown in FIGS. 22 through 24.

Although the dimensions of the cathodoluminescent display devices are much larger than those of the OLED display devices, the same techniques may be applied to join the display elements using an optical integrating structure and to form a black matrix which tends to hide any mullions that are used to couple the display elements together.

Although the invention has been described in terms of an exemplary embodiment, it is contemplated that it may be practiced as described above within the scope of the appended claims.

What is claimed:

1. An electronic display structure comprising:
    a circuit board having a top surface and a bottom surface and including circuitry for providing a plurality of electrical signals;
    a picture element (pixel) structure having a predetermined area including;
    a patterned first electrode, coupled to the top surface of the circuit board to receive a first electrical signal of the plurality of electrical signals;
    a patterned display material having a bottom surface and a top surface, the bottom surface being in close proximity to the first electrode; and
    a second electrode, positioned in close proximity to the top surface of the patterned display material; and
    a connecting via extending through the pixel structure from the top surface of the circuit board to couple the second electrode to receive a second electrical signal of the plurality of electrical signals, wherein the first patterned electrode and the patterned display material are sized and arranged such that the connecting via does not interfere with the patterned first electrode or the patterned display material.

2. An electronic display structure according to claim 1 further comprising a plurality of pixel structures, coupled to the circuit board and arranged in a matrix as rows and columns wherein the patterned display material of each of the plurality of pixel structures is offset from the center of the pixel area in at least one of the horizontal and vertical directions such that connecting vias may be formed through the pixel structures along an edge of the matrix of pixel structures.

3. An electronic display structure according to claim 2, wherein respective central portions of the patterned display materials of adjacent pixel structures coupled to the circuit board are separated by a predetermined distance D, the circuit board has an edge and the pixel structures coupled to edge of the circuit board have a distance between a central portion of the patterned display material and the edge of the circuit board which is less than or equal to D/2.

4. An electronic display structure according to claim 2, wherein the patterned display material of each of the plurality of pixel structures is offset from the center of the pixel area in both the horizontal and vertical directions such that connecting vias may be formed through the pixel structures along two adjacent edges of the matrix of pixel structures.

5. An electronic display structure according to claim 2, wherein the matrix of pixel structures includes a display section having a top side and a bottom side and an electronics section having a front side and a back side, and the connecting vias are coupled to connecting pads on the bottom side of the display section, the connecting pads being arranged to couple with corresponding connecting pads on the front side of the electronics section.

6. An electronic display structure according to claim 5, wherein the display section includes a plurality of pixels arranged in N rows and M columns, where N and M are integers, and the display section includes at least N+M connecting pads and each of the N+M connecting pads is electrically coupled to a respectively different one of the row and column electrodes.

7. An electronic display structure according to claim 6, wherein each of the N+M connecting pads is electrically coupled to its respective row or column electrode at a plurality of positions.

8. An electronic display structure according to claim 6, wherein the display section includes at least N+2M connecting pads, wherein N of the connecting pads are electrically coupled to respective ones of the N row electrodes and 2M of the connecting pads are coupled to the M column electrodes such that each column electrode is coupled to at least two connecting pads.

9. An electronic display structure according to claim 1, further comprising a plurality of pixel structures, coupled to the circuit board and arranged in a matrix as rows and columns wherein the patterned display material of each of the plurality of pixel structures is centered in the pixel area.

10. A tiled display structure comprising a plurality of image tiles, each tile comprising:
- a plurality of pixel structures, arranged in a matrix having rows and columns and including a plurality of contacts for receiving electrical signals;
- a circuit board having a top surface and a bottom surface;
- a memory coupled to the bottom surface of the circuit board, the memory storing image data to be displayed;
- pixel driving circuitry coupled to the bottom surface of the circuit board and responsive to the image data stored in the memory to provide a plurality of electrical signals which are conditioned to activate respective ones of the plurality of pixel structures;
- timing circuitry, coupled to the bottom surface of the circuit board and responsive to a timing signal to sequentially scan the pixel driving circuitry to provide electrical signals to successive rows of the matrix of pixel structures;
- a plurality of electrical contacts coupled to the top surface of the circuit board to receive the plurality of electrical signals provided by the pixel driving circuitry, the plurality of electrical contacts having a one-to-one correspondence with the plurality of contacts of the matrix of pixel structures;
- means for coupling the plurality of electrical contacts on the top surface of the circuit board to the plurality of contacts of the matrix of pixel structures;
- a back panel including a plurality of connectors, each of the connectors providing operational power to a respectively different one of the image tiles;
- a frame having sides including a plurality of springs mounted around the sides of the frame the plurality of springs being configured to urge the tiles away from the sides of the frame;
- a transparent front panel secured to the frame; and
- a plurality of springs mounted on the back panel, wherein the plurality of tiles are placed against the transparent front panel and held in compression by the plurality of springs on the back panel;
- wherein, plurality of connectors on the back panel are flexible connectors which allow individual ones of the plurality of tiles to move in response to forces exerted by the springs mounted on the frame and the springs mounted on the back panel.

11. A tiled display structure according to claim 10, wherein the back panel structure includes further flexible connectors which provide the image data and timing signals to the plurality of image tiles.

12. A tiled display structure comprising a plurality of image tiles, each tile comprising:
- a circuit board having a top surface and a bottom surface;
- a display section including a glass substrate and a plurality of pixel structures, each pixel structure defining a pixel area and having an active region which occupies a portion of the pixel area, the plurality of pixel structures being arranged in a matrix having rows and columns and including a plurality of contacts for receiving electrical signals;
- pixel driving circuitry coupled to the bottom surface of the circuit board and responsive to image data stored in a memory to provide a plurality of electrical signals to respective ones of the electrical contacts of the pixel structures to selectively activate the plurality of pixel structures;
- a transparent front panel having a plurality of rows and columns of dark-colored lines, the plurality of lines being substantially equal in width and defining transparent regions on the front panel for pixel positions in the tiled display device; and
- means for securing the glass substrate of the display sections of the plurality of tiles to the transparent front panel to align the active region of each pixel area on each tile with a respectively different one of the defined transparent regions on the front panel.

13. A tiled display structure according to claim 12, wherein the means for securing the glass substrates of the plurality of tiles to the transparent front panel includes a transparent adhesive.

14. A tiled display structure according to claim 13, wherein the means for securing the glass substrates of the plurality of tiles to the transparent front panel includes a plurality of mullions attached to the transparent front panel at positions corresponding to respective ones of the dark lines, the mullions forming openings on the transparent front panel shaped to receive respective ones of the glass substrates of the plurality of tiles.

15. A tiled display structure comprising a plurality of image tiles, each tile comprising:
- a circuit board having a top surface and a bottom surface;
- a display section including a glass substrate having a front surface and a back surface, the display section further including a plurality of pixel structures, coupled to the back surface of the glass substrate, each pixel structure defining a pixel area and having an active region which occupies a portion of the pixel area, the plurality of pixel structures being arranged in a matrix having rows and columns and including a plurality of contacts for receiving electrical signals, wherein the front surface of the glass substrate includes a plurality of dark-colored lines having a predetermined width which form a black matrix surrounding the active regions of the plurality of pixel structures;
- pixel driving circuitry coupled to the bottom surface of the circuit board and responsive to the image data stored in the memory to provide a plurality of electrical signals to respective ones of the electrical contacts of the pixel structures to selectively activate the plurality of pixel structures; and
- a plurality of mullions each of which joins the glass substrate of one of the image tiles to the glass substrate of another one of the image tiles, the mullions having a "T" shaped cross section which defines a crossbar and a stem, the crossbar having a width substantially equal to the predetermined width, wherein the plurality of mullions join the plurality of tiles to form the tiled display structure.

16. A tiled display structure according to claim 15, wherein the stems of the plurality of mullions have a color having reflective properties which approximate reflective properties of the glass substrate.

17. A tiled display structure according to claim 15, wherein the stems of the plurality of mullions are substantially transparent.

18. A tiled display structure comprising:
   a single circuit board having a top surface and a bottom surface;
   a plurality of display tile sections, each display tile including a plurality of pixel structures, each pixel structure defining a pixel area, the plurality of pixel structures being arranged in a matrix having rows and columns and including a plurality of contacts for receiving electrical signals; and
   pixel driving circuitry coupled to the bottom surface of the circuit board to provide a plurality of electrical signals to respective ones of the electrical contacts of the plurality of display sections to selectively activate the plurality of pixel structures on all of the display sections.

19. A display structure comprising:
   a plurality of circuit boards, each having a top surface and a bottom surface;
   a single display section, including a plurality of pixel structures, each pixel structure defining a pixel area, the plurality of pixel structures being arranged in a matrix having rows and columns and including a plurality of contacts for receiving electrical signals;
   a plurality of pixel driving circuits coupled to the bottom surfaces of the respective plurality of circuit boards, to provide a plurality of electrical signals to respective ones of the electrical contacts of the single display section to selectively activate the plurality of pixel structures on the display sections.

20. A tiled display structure comprising a plurality of image tiles, each tile comprising:
   a display section including a plurality of cathodoluminescent display devices, each of the plurality of cathodoluminescent devices including:
   a plurality of distinct phosphor areas;
   a single cathode which emits an electron beam directed toward the phosphor areas to illuminate the phosphor areas; and
   at least one electrostatic deflection grid which is used to selectively direct the electron beam to selected ones of the plurality of phosphor areas.

21. A tiled display structure according to claim 20, wherein the plurality of cathodoluminescent display devices each include a two horizontal deflection grids for selectively horizontally deflecting the electron beam and two vertical deflection grids for selectively vertically deflecting the electron beam.

22. A brightness compensation system for a display device, having a plurality of display elements which change in brightness over time comprising:
   a first memory which holds a plurality of data values representing respective signals to be applied to the plurality of display elements to cause each display element to produce a brightness level which approximates a predetermined brightness level;
   circuitry which accumulates a measure of the current applied to each of the respective display elements overtime and which stores the accumulated current values in a second memory; and
   compensation circuitry which periodically changes the data values held in the first memory for each display element responsive to the respective values in the first and second memories.

23. A brightness compensation system according to claim 22, further including a third memory which holds a plurality of data values representing respective aging characteristics of each of the plurality of pixel values, the aging characteristics being determined from the performance of each of the plurality of display elements during a burn-in period, wherein the compensation circuitry updates the data values held in the first memory responsive to the respective values in the first, second and third memories.

24. A brightness compensation system according to claim 23, wherein the display elements are organic light emitting diode (OLED) elements, the values held in the first memory are respective current levels to be applied to the OLED elements to produce the predetermined brightness level and the system further includes:
   a fourth memory which holds a plurality of data values representing respective initial voltage values applied to each display element to produce the respective current levels represented by the values in the first memory; and
   circuitry which measures, for each OLED element, a present voltage value used to produce the current value represented by the value in the first memory, and generates a difference of the present voltage value and the respective voltage value stored in the fourth memory and which stores the difference value in a fifth memory;
   wherein the compensation circuitry updates the data values held in the first memory responsive to the respective values in the first, second, third and fifth memories.

25. A tiled display structure comprising a plurality of image tiles, each tile comprising:
   a display section including a plurality of cathodoluminescent display devices, each of the plurality of cathodoluminescent devices including:
   a plurality of distinct phosphor areas arranged in a two-dimensional matrix;
   a single row of cathodes having a number of elements equal to the number of phosphor areas in one dimension of the two-dimensional matrix, each of the cathodes emitting a respective electron beam directed toward the phosphor areas to illuminate the phosphor areas; and
   at least one electrostatic deflection grid which is used to selectively scan the electron beam in the other dimension of the two-dimensional matrix to illuminate selected ones of the plurality of phosphor areas.

26. A tiled display structure according to claim 25, wherein the plurality of cathodoluminescent display devices each includes two electrostatic deflection grids for selectively deflecting the electron beam along the other dimension of the two-dimensional matrix.

27. A tiled display structure according to claim 25, wherein the plurality of cathodoluminescent display devices each includes two electromagnetic defection grids for selectively deflecting the electron beam along the other dimension of the two-dimensional matrix.

28. An array of display devices comprising respective multiple passive matrix sub-arrays such that multiplexing of image data to the sub-arrays is limited to a pre-determined maximum.

* * * * *